US007888686B2

(12) United States Patent
Chik et al.

(10) Patent No.: US 7,888,686 B2
(45) **Date of Patent: *Feb. 15, 2011**

(54) PIXEL STRUCTURE FOR A SOLID STATE LIGHT EMITTING DEVICE

(75) Inventors: George Chik, Nepean (CA); Thomas MacElwee, Nepean (CA); Iain Calder, Kanata (CA); E. Steven Hill, Denver, CO (US)

(73) Assignee: Group IV Semiconductor Inc., Kanata, Ontario (CA)

(*) Notice: Subject to any disclaimer, the term of this patent is extended or adjusted under 35 U.S.C. 154(b) by 341 days.

This patent is subject to a terminal disclaimer.

(21) Appl. No.: 12/015,285

(22) Filed: Jan. 16, 2008

(65) Prior Publication Data

US 2008/0246046 A1 Oct. 9, 2008

Related U.S. Application Data

(63) Continuation-in-part of application No. 11/642,813, filed on Dec. 21, 2006.

(60) Provisional application No. 60/754,185, filed on Dec. 28, 2005.

(51) Int. Cl.
*H01L 33/00* (2010.01)
*H01L 33/06* (2010.01)

(52) U.S. Cl. ............................ 257/79; 257/80; 257/94; 257/98; 257/100; 257/E33.001; 257/E33.011; 257/E33.068; 438/22; 438/38; 438/47; 438/48

(58) Field of Classification Search .................. 257/79, 257/80, 94, 98, 100, E33.001, E33.011, E33.068; 438/22, 38, 47, 48
See application file for complete search history.

(56) References Cited

U.S. PATENT DOCUMENTS

| | | | | |
|---|---|---|---|---|
| 5,406,575 | A * | 4/1995 | Chelny et al. | 372/45.013 |
| 5,517,039 | A * | 5/1996 | Holonyak et al. | 257/94 |
| 6,242,761 | B1 * | 6/2001 | Fujimoto et al. | 257/94 |
| 7,081,664 | B2 | 7/2006 | Hill | |
| 7,122,842 | B2 | 10/2006 | Hill | |
| 7,173,277 | B2 * | 2/2007 | Tamura et al. | 257/59 |
| 2004/0151461 | A1 | 8/2004 | Hill | |
| 2004/0214362 | A1 | 10/2004 | Hill et al. | |
| 2004/0252738 | A1 | 12/2004 | Hill | |
| 2005/0041434 | A1 | 2/2005 | Yatsuda et al. | |
| 2005/0088853 | A1 | 4/2005 | Yatsuda et al. | |
| 2010/0032704 | A1 * | 2/2010 | Denbaars et al. | 257/98 |

* cited by examiner

*Primary Examiner*—Dao H Nguyen
(74) *Attorney, Agent, or Firm*—Allen, Dyer, Doppelt, Milbrath & Gilchrist, P.A.

(57) ABSTRACT

A light emitting device includes an active layer structure, which has one or more active layers with luminescent centers, e.g. a wide bandgap material with semiconductor nano-particles, deposited on a substrate. For the practical extraction of light from the active layer structure, a transparent electrode is disposed over the active layer structure and a base electrode is placed under the substrate. Transition layers, having a higher conductivity than a top layer of the active layer structure, are formed at contact regions between the upper transparent electrode and the active layer structure, and between the active layer structure and the substrate. Accordingly the high field regions associated with the active layer structure are moved back and away from contact regions, thereby reducing the electric field necessary to generate a desired current to flow between the transparent electrode, the active layer structure and the substrate, and reducing associated deleterious effects of larger electric fields.

20 Claims, 24 Drawing Sheets

Figure 2. Reduction of electric field with increasing excess silicon content for a constant current density of 1.5 $mA/cm^2$. The increase of direct tunneling is clearly seen as the silicon content is increased.

PIXEL STRUCTURE FOR A SOLID STATE LIGHT EMITTING DEVICE

CROSS-REFERENCE TO RELATED APPLICATIONS

The present invention is a continuation-in-part of U.S. patent application Ser. No. 11/642,813, filed Dec. 21, 2006 which claims priority from U.S. patent application No. 60/754,185 filed Dec. 28, 2005, which are incorporated herein by reference.

TECHNICAL FIELD

The present invention relates to light emitting devices, and in particular to pixel structures for light emitting devices providing practical solid state light emitting devices.

BACKGROUND OF THE INVENTION

To build lighting systems for illumination and projection, there are significant advantages to being able to tailor the shape of the light source, since the shape of the light source and the optical components of the system provide the means to precisely shape the resulting light beam. The shape of the resulting light beam is an important aspect of the lighting system, especially in the creation of solid-state headlamps for the automotive industry, as disclosed in United States Published Patent Applications Nos. 2005/088853, entitled Vehicle Lamp, published Apr. 28, 2005 to Yatsuda et al; and 2005/041434, entitled Light Source and Vehicle Lamp, published Feb. 24, 2005 to Yasushi Yatsuda et al. The principle of operation is to construct an arrangement of light-source elements positioned in such a manner as to form an emission shape and a brightness distribution that can create a light distribution pattern when combined with suitable optics.

Unfortunately, conventional shaped light emitting devices must be constructed from a number of individual light emitting elements, such as LEDs, which typically cannot be constructed with an area greater than about four $mm^2$ due to inherent limitations in compound semiconductor processing technologies, e.g. a lattice mismatch between substrate and active layers. Moreover, the individual light emitting elements typically cannot be positioned within five millimeters of each other, because of the need to provide physical mounting, optical coupling and electrical interconnection for each of the individual elements. Accordingly, the emissive shapes constructed do not provide a contiguous illuminated area, and have inherent limitations on the available brightness per unit area. Furthermore, the refinement or smoothness of the shape is limited by the granularity of the individual lighting elements, and the light emitting elements cannot be made smaller than a certain size because of the physical constraints in their mounting and interconnection.

Recent research into the nature of electrical conduction and light emission from nano-particles formed in wide bandgap semiconductor materials or insulating dielectrics has been conducted in an effort to increase the conductivity of the wide bandgap dielectric semiconductor materials, which exhibit very little conductivity, through the formation of nano-particles within the insulating material. With the application of a suitable electric field, current can be made to flow through the tunneling process, which can transfer energy efficiently from the applied electric field to the nano-particles and store that energy in the form of excitons through the impact ionization process in the silicon nano-particles. The excitons can radiatively recombine releasing a photon, whose energy is determined by the size of the nano-particles in the wider bandgap material or the nano-particles can transfer the energy to a rare earth dopant, which will emit a photon at a characteristic wavelength. A wide bandgap dielectric layer with nano-particles constitutes an optically active layer including a concentration of luminescent centers. Several materials can be used as the wide bandgap semiconductor or dielectric material including GaN, silicon nitride, and silicon dioxide. The luminescent centers can be formed from a wide variety and combination of compatible materials including silicon, carbon, germanium, and various rare earths.

For technical and economic reasons, Silicon Rich Silicon Oxide (SRSO) films are being developed for the purposes of studying the efficient generation of light from silicon based materials. The SRSO films consist of silicon dioxide in which there is excess silicon and possibly the incorporation of rare earths into the oxide. The amount of excess silicon will determine the electrical properties of the film, specifically the bulk conductivity and permittivity. With the excess silicon in the oxide, the film is annealed at a high temperature, which results in the excess silicon coalescing into tiny silicon nano-particles, e.g. nanocrystals, dispersed through a bulk oxide film host matrix. The size and distribution of the silicon nano-particles can be influenced by the excess silicon originally incorporated at deposition and the annealing conditions.

Optically active layers formed using semiconductor nano-particles embedded within a wider bandgap semiconductor or dielectric have been demonstrated in U.S. Pat. No. 7,081,664, entitled: "Doped Semiconductor Powder and Preparation Thereof", issued Jul. 25, 2006 in the name of Hill; and U.S. Pat. No. 7,122,842, entitled Solid State White Light Emitter and Display Using Same, issued Oct. 17, 2006 to Hill; and United States Published Patent Applications Nos. 2004/151461, entitled: "Broadband Optical Pump Source for Optical Amplifiers, Planar Optical Amplifiers, Planar Optical Circuits and Planar Optical Lasers Fabricated Using Group IV Semiconductor Nanocrystals", published Aug. 5, 2004 in the name of Hill; 2004/214362, entitled: "Doped Semiconductor Nanocrystal Layers and Preparation Thereof", published Oct. 28, 2004 in the name of Hill et al; and 2004/252738, entitled: "Light Emitting Diodes and Planar Optical Lasers Using IV Semiconductor Nanocrystals", published Dec. 16, 2004 in the name of Hill, which are incorporated herein by reference. The aforementioned references relate to different forms of the active semiconductor layer, and to the underlying physical principals of operation of the active semiconductor layers. Accordingly, no serious effort has been made to determine the structural requirements necessary to industrialize or provide practical solutions for manufacturing solid state light emitting devices including the active semiconductor layers.

With reference to FIG. 1, a conventional implementation of a practical light emitting device 1 including the above mentioned materials would consist of a starting conducting substrate 2, e.g. an N+ silicon substrate, on which an active layer 3 of a suitable thickness of a dielectric material, e.g. silicon dioxide, with a concentration of luminescent centers, e.g. rare earth oxides or nano-particles, deposited therein. The injection of electric current into the active layer 3 and the ability to view any light that might be generated within the active layer 3 will require a transparent conducting electrode, e.g. a transparent conductive oxide (TCO) layer 4 to be deposited on top of the active layer 3. Indium Tin Oxide, ITO, is currently the most widely used transparent conducting oxide in opto-electronic devices due to its excellent optical transmission and conductivity characteristics. ITO is a degenerately doped semiconductor with a bandgap of approximately 3.5 eV. Typical sheet resistances measured for the ITO range from as low as 10 Ω/sq to well over 100 Ω/sq. The conductivity is due the very high carrier concentrations found in this material. The work function of the ITO layer 4 is found to be between 4.5 eV and 4.8 eV depending on the deposition conditions. The work function of the N+ silicon substrate 2 is 4.05 eV. The difference in work functions between the ITO layer 4 and the silicon substrate 2 will result in an asymmetry in the electron current injection depending on which interface is biased as the cathode and injecting charge. The work function dominates the contact characteristics and is very important to the stable and reliable operation of any electro-luminescent device.

Subsequently, a metallization step is conducted forming ohmic contacts 5 and 6 onto the ITO layer 4 and the substrate 2, respectively, for injection of electric current. Application of high electric fields will be required for proper operation and the resulting current flow will consist of hot energetic carriers that can damage and change the electronic properties of the optical active layer 3 and any interfaces therewith.

As an example, the substrate 2 is a 0.001 Ω-cm n-type silicon substrate with an approximately 150 nm thick SRSO active layer 3, doped with a rare earth element for optical activity, deposited thereon. The transparent conducting electrode 4 is formed using a 300 nm layer of ITO. Finally metal contact layers 5 are formed using a TiN/Al stack to contact the front side ITO 4, and an Al layer 6 is used to contact the back side of the silicon wafer substrate 2.

At low electric fields in the SRSO active layer 3, there is no current flow and the structure behaves as a capacitor. With the application of an electric field larger than a characteristic threshold field, electrons can be injected into the SRSO active layer 3 from either the N+ substrate 2, via contact 6, or the ITO electrode 4, via contact 5, depending on their bias. Electrons residing in the potential wells due to the silicon nano-particles undergo thermal emission coupled with field induced barrier lowering to tunnel out of the nano-particle traps and into the conduction band of the host $SiO_2$ matrix. Once in the conduction band of the host matrix, the electrons are accelerated by the applied electric field gaining kinetic energy with distance traveled. The distance between the silicon nano-particles will determine the total energy gain of the electrons per hop.

To produce green light at a wavelength of 545 nm, the SRSO active layer 3 may be doped with the rare earth dopant Erbium or Terbium. The energy associated with the emission of a 545 nm photon is approximately 2.3 eV. For current flow between the silicon nano-particles in the active layer 3 to be dominated by ballistic transport, the maximum spacing between the nano-particles should be <5 nm. For a 4 nm spacing, the minimum magnitude of the electric field is found to be approximately 6 Mv/cm, at which the conduction electrons can become quite hot and cause considerable damage to the oxide between the nano-particles through the generation of bulk oxide traps and at the interfaces between the silicon substrate 2 and active layer 3, and the active layer 3 and the ITO layer 4 through the creation of interface states. ITO may be susceptible to damage from high electric fields of approximately 1 MV/cm, which is believed may lead to the decomposition of $In_2O_3$ and $SnO_2$. If the fields at the surface of the ITO are high enough, the indium and or tin ions can migrate with in the near surface region and concentrate at the active layer interface, this would cause a local reduction in the work function. The work function locally in this region would be reduced to approximately 4.4 eV and 4.2 eV for indium and tin, respectively, which would result in a significant increase in the electron injection characteristics of the ITO layer 4 and the formation of hot spots due to local current hogging potentially leading to device destruction.

The second effect that high electric field have on the device structure is the formation of trapped electronic states located in the band gap of the $SiO_2$ region and interface states located at the active layer/silicon substrate. Generation of trap states in the $SiO_2$ region will reduce the internal electric field and current conduction of the SRSO film requiring the application of higher electric fields to sustain a constant current flow. Positive charge trapping can also occur either through hole injection from the substrate or from impact ionization processes. For conduction electrons with energies >2 eV, traps are formed through the release of hydrogen decorated defects located at the anode. The hydrogen drifts under the applier field towards the cathode where it produces interface states capable of trapping electrons and limiting the current flow.

In the simple structure described above, planar breakdown of the active layer 3 at the edge of the light emitting device 1 will dominate and limit the electric field that can be applied thereto. All of these effects serve to modify, and in some instances increase, the internal electric field in the vicinity of the contact interfaces with the active layer 3, which will lead to an early breakdown and destruction of the light emitting device 1.

An object of the present invention is to overcome the shortcomings of the prior art by providing a light emitting structure in which field oxide regions are disposed below metal contacts to minimize edge related breakdown. Moreover, to overcome the problem of propagating breakdown and large area emitting apertures the total emitting area is subdivided into smaller area subpixel emitters that are laterally isolated from one another by the presence of a thick field oxide region.

SUMMARY OF THE INVENTION

Accordingly, the present invention relates to a light emitting device comprising:

a substrate;

an active layer structure supported on the substrate including at least a first active layer with a concentration of luminescent centers for emitting light at a first wavelength;

a set of electrodes for applying an electric field to the active layer structure including an upper transparent electrode and a second base electrode;

a metal electrical contact electrically connected to the transparent electrode for applying the electric field thereto; and a field oxide region below the electrical contact to minimize current injection below the electrical contact, thereby maximizing current flow in active layer structure adjacent to the metal electrical contact.

BRIEF DESCRIPTION OF THE DRAWINGS

The invention will be described in greater detail with reference to the accompanying drawings which represent preferred embodiments thereof, wherein.

DETAILED DESCRIPTION

Figure 1:
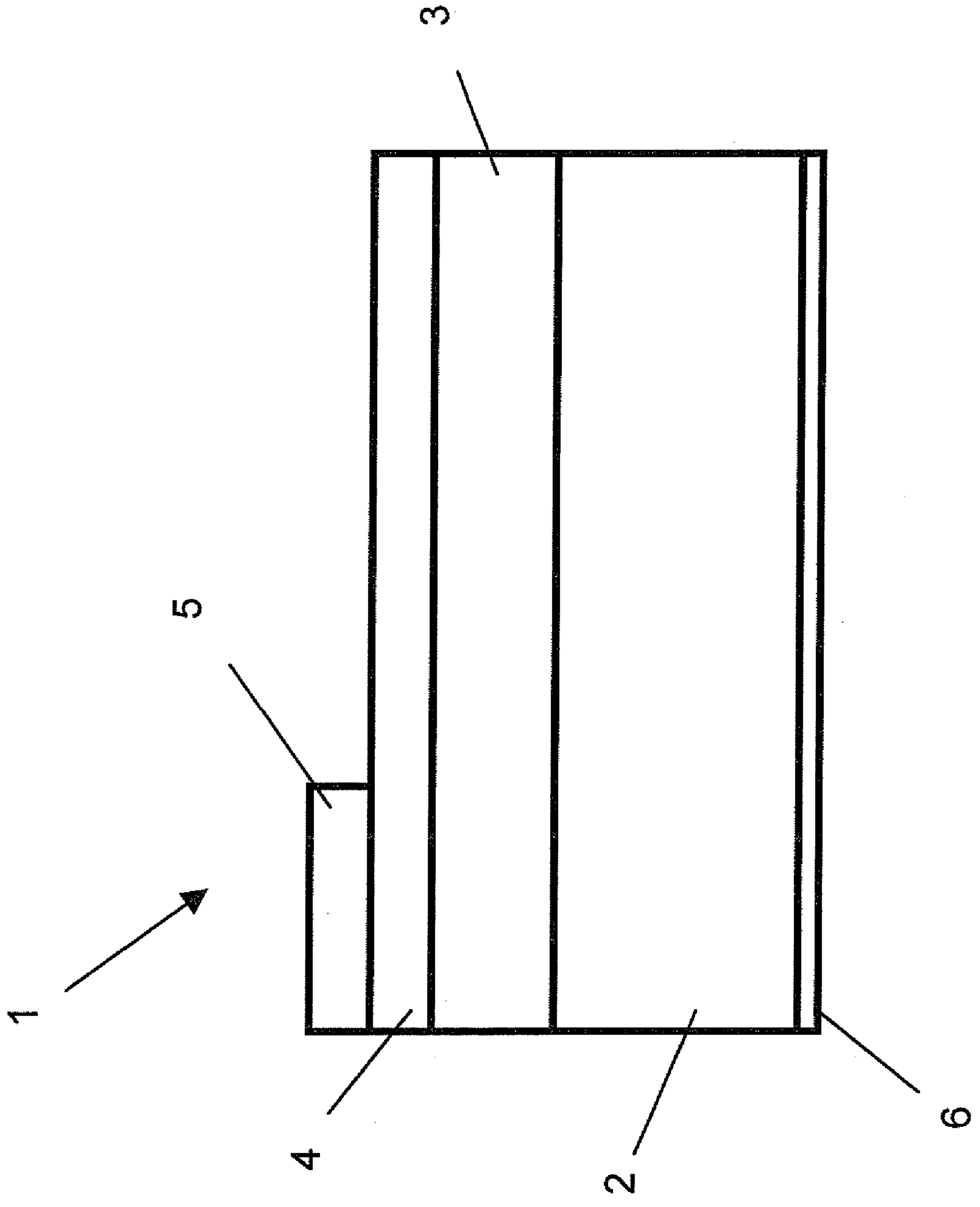
Figure 1 Prior Art
FIG. 1 illustrates a conventional light emitting device.
Figure 2:
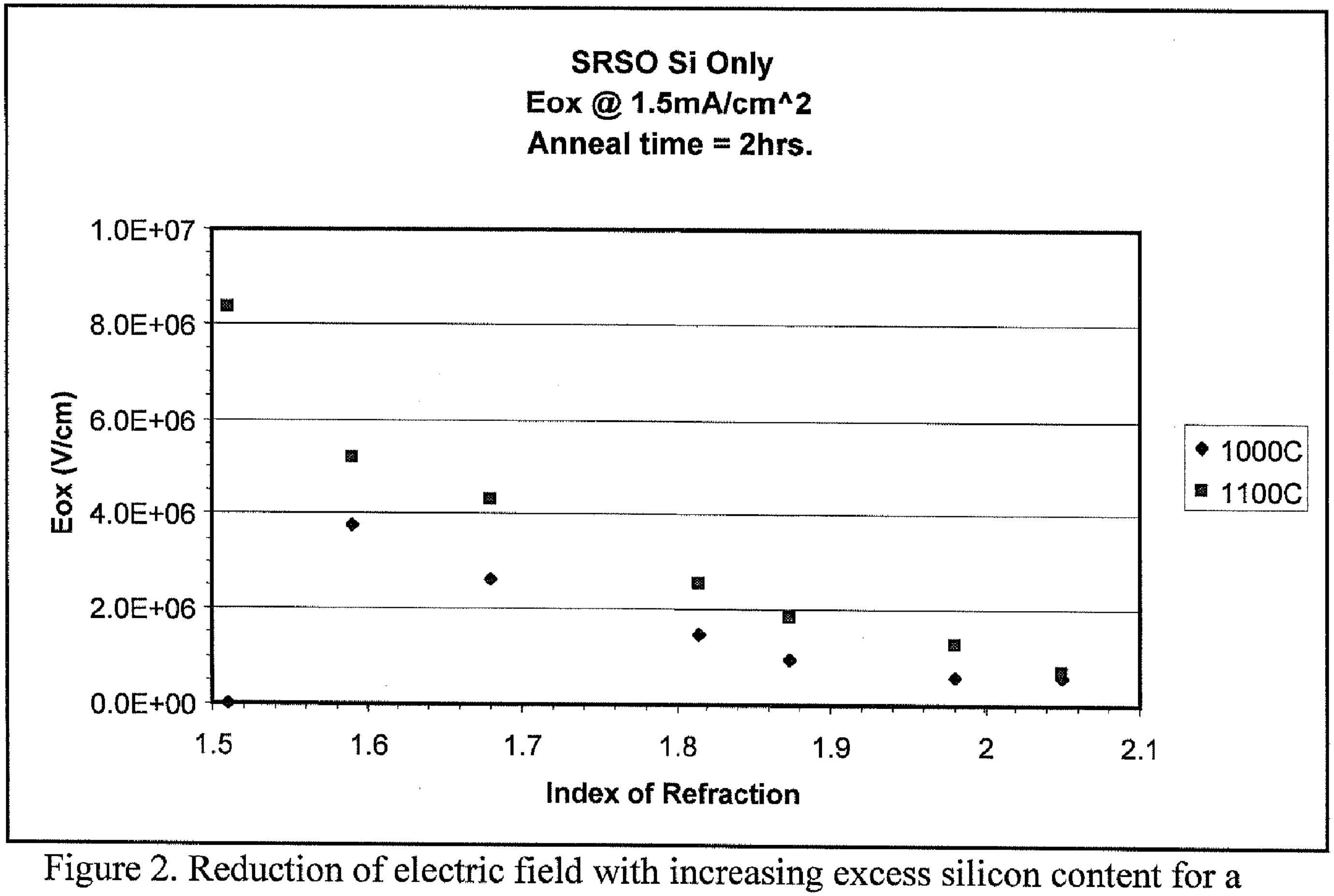
FIG. 2 is a plot of refractive index vs. electric field strength for different silicon rich silicon oxide active layers.
Figure 3:
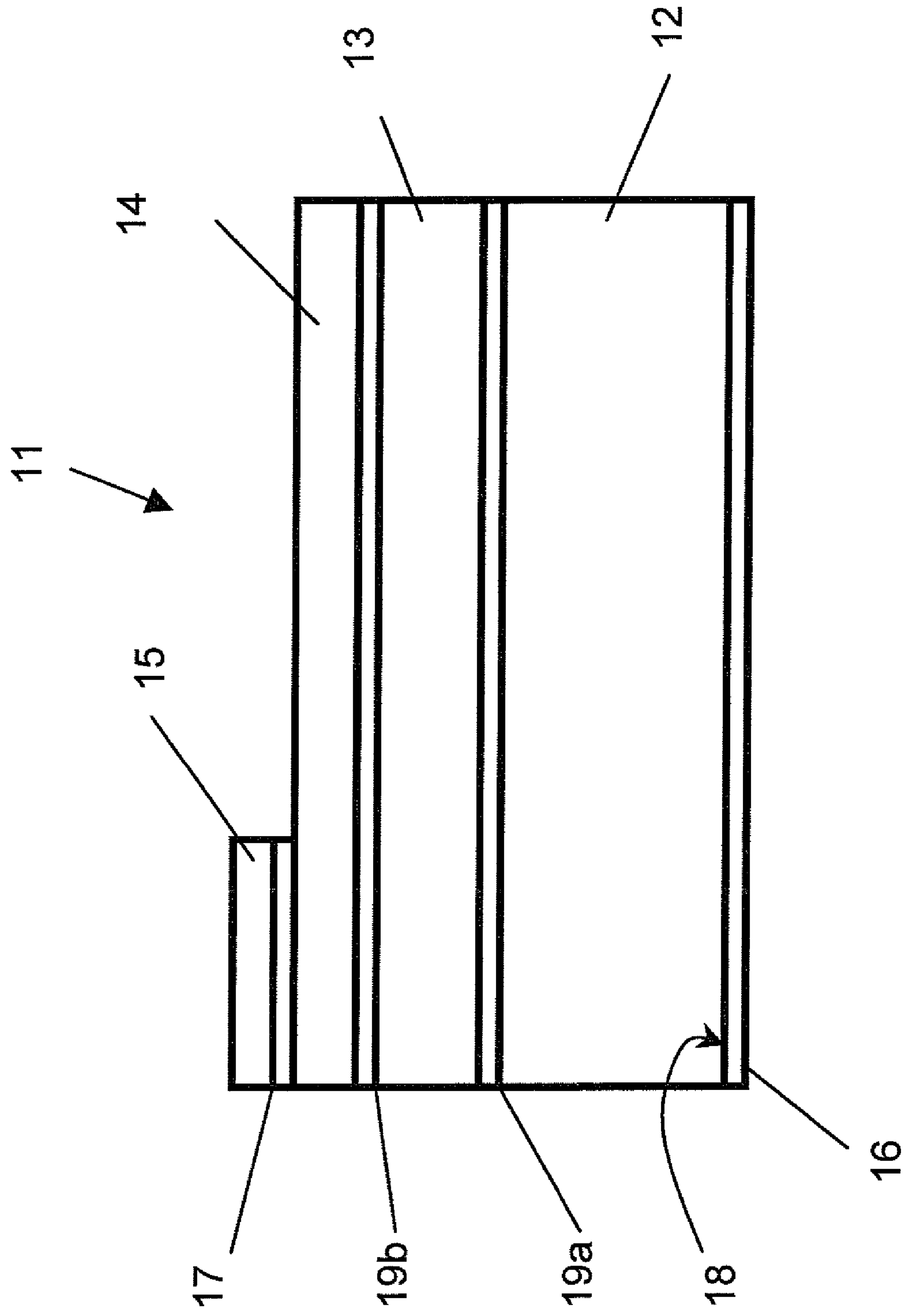
FIG. 3 is a side view of a light emitting device according to the present invention with transition layers.

With reference to FIG. 3, a light emitting device 11 according to the present invention includes a suitable semiconductor substrate 12, onto which an active layer structure 13 is deposited. The substrate 12, on which the active layer structure 13 is formed, is selected so that it is capable of withstanding high temperatures in the order of 1000° C. or more. Examples of suitable substrates include silicon wafers or poly silicon layers, either of which can be n-doped or p-doped, e.g. with $1\times10^{20}$ to $5\times10^{21}$ of dopants per $cm^3$, fused silica, zinc oxide layers, quartz, sapphire silicon carbide, or metal substrates. Some of the above substrates can optionally have a thermally grown oxide layer, which oxide layer can be of up to about 2000 nm in thickness, a thickness of 1 to 20 nm being preferred. Some of the above substrates can optionally have a deposited electrically conducting layer, which can have a thickness of between 50 and 2000 nm, but preferably between 100 and 500 nm. The thickness of the substrate is not critical, as long as thermal and mechanical stability is retained.

The active layer structure 13 can be comprised of a single or of multiple active layers including luminescent centers, each layer having an independently selected composition and thickness, e.g. rare earth oxides or other semiconductor material with luminescent centers activated by impact ionization or impact excitation. In a preferred embodiment the active layers are comprised of rare earth elements, e.g. Er, Ce, Eu, Th and rare earth oxides thereof, in a silicon dioxide ($SiO_2$) matrix, with $SiO_2$ buffer layers between adjacent active layers. Alternatively, the active layer structure 13 can include semiconductor (group IV, such as Si, Ge, Sn and Pb) nano-particles in a wide band gap or dielectric material (e.g. Group IV, such as Si, Ge, Sn and Pb) Oxide or Nitride matrix with or without rare earth doping elements and with or without carbon doping, as will hereinafter described. Specific examples include silicon nano-particles in a silicon dioxide matrix (SRSO), and silicon nano-particles in a silicon nitride matrix. Alternatively, the active layers can be comprised of rare earth oxides. By using active layers having different compositions, a multi-color structure can be prepared. For example, combining cerium layers, terbium layers and europium layers in a single multi-layer structure provides a structure that can fluoresce at green (terbium), blue (cerium), and red (europium) or color combinations thereof, e.g. a combination of all three resulting in white light. The active layers can be either stacked or constructed side by side as separately controllable circuit elements. The active layer structure 13 could be deposited by one of many appropriate methods, such as plasma enhanced chemical vapor deposition (PECVD), molecular beam epitaxy, pulsed laser deposition, sputtering, and sol-gel processes. Preferably, the rare earth elements are lanthanide element, such as cerium, praeseodymium, neodynium, promethium, gadolinium, erbium, thulium, ytterbium, samarium, dysprosium, terbium, europium, holmium, or lutetium; however, they can also be an actinide element, such as thorium.

A top transparent current-injection (electrode) layer 14, e.g. a transparent conducting oxide (TCO), such as indium tin oxide (ITO), is mounted on the active layer structure 13, which, along with bottom electrode 16, enables AC or DC power to be applied to the active layer structure 13. Preferably, the current injection layer 14 has a thickness of from 150 to 500 nm, and the chemical composition and the thickness thereof are such that the semiconductor structure has a resistivity of less than 70 ohm-cm. A buffer electrical contact 17, e.g. TiN, is positioned between the front current-injection layer 14 and a top electrical contact 15, e.g. Al. The buffer contact 17 provides an ohmic contact point between the front current-injection layer 14 and the top electrical contact 15, while the top electrical contact 15 provides a suitable surface for wire bonding contact. Other suitable materials for transparent electrodes 14 and buffer electrical contact 17 might alternatively be employed. A back reflector 18 can be provided between the active layer structure 13 and the substrate 12 to reflect light that is internally emitted towards the substrate 12 back towards the emitting surface, i.e. the TCO current injection layer 14.

In conventional light emitting devices, the optically active SRSO layer typically has an excess silicon concentration resulting in a measured index of 1.5 to 1.6. An electric field of approximately 6 Mv/cm at the contact interfaces is needed to cause 1.5 $mA/cm^2$ of electron current to flow in such an SRSO layer. By adding thin setback or transition layers 19*a* and 19*b* at the interfaces of the active layer structure 13 with the substrate 12 and the current injection layer 14, respectively, in particular when the active layer structure 12 includes upper and lower layers comprised of some form of wide bandgap or dielectric material that has a relatively low conductance, the same current can be made to flow through the optically active layer structure 13, but the electric field at the injecting interfaces, e.g. between the TCO 14 and the active layer structure 13 and between the active layer structure 13 and the substrate 12, will now be reduced from 6 MV/cm to $<2$ MV/cm. Preferably, the transition layers 19*a* and 19*b* are formed of the same or similar material as the active layer structure 13 during growth thereof, but with a higher conductivity, i.e. a higher concentration of material and a higher index relative thereto, e.g. SRSO with an index ranging from 1.9 to 2.3. However, positioning other conductive materials, e.g. metals etc, in the transition layers 19*a* and 19*b* are possible The transition layers 19*a* and 19*b* significantly increase the injection efficiency of electrons from the contact electrodes 15 and 16 into the active layer structure 13 and reduce work function asymmetries through direct tunneling from the contact interfaces, as evidenced by the reduced electric field required for current flow. The transition layers 19*a* and 19*b* provide increased resistance to hot electron effects associated with the interfaces, and also provide shielding to the current injection layer 14 and the silicon substrate 12 interfaces from local charge buildup leading to electric field enhanced current injection. Moreover, they serve as set back layers to set the high field regions associated with the optically active region back and away from the contact interfaces. Accordingly, the addition of transition layers 19*a* and 19*b* significantly improve reliability and lifetime of the device 11.

For a 200 nm thick SRSO active layer structure 13, the transition layers 19*a* and 19*b* are in the order of 5 nm to 20 nm, preferably 8 nm to 12 nm, and most preferably 10 nm, i.e. preferably 2.5% to 10%, more preferably 4% to 6%, and most preferably 5%, of the thickness of the active layer structure 13, would be sufficient to reduce the electrical field at the interfaces significantly. The transition layers 19*a* and 19*b* should result in a reduction in the high field trap and interface generation issues as discussed above leading to a more robust and efficient optically active device structure.

In an exemplary process, the semiconductor, e.g. silicon, component of the growth process is initially set to a high value at the beginning of the deposition. The value is determined based on the desired index and hence excess semiconductor, e.g. silicon, content desired. After the appropriate thickness of the first transition layer 19*a* is deposited, the semiconductor component of the growth process is adjusted to the value or values required for the formation of the one or more layers in the active layer structure 13. Once a sufficient thickness of the active layer structure 13 has been deposited, the semiconductor component of the growth process is again increased to the high value used initially and the desires thickness of the second transition layer 19*b* is deposited. Once finished, the growth process is terminated and the film is suitably annealed to form the semiconductor nano-particles, e.g. silicon nanocrystals, in the active and transition layers.

Field Oxide Regions

Figure 4:
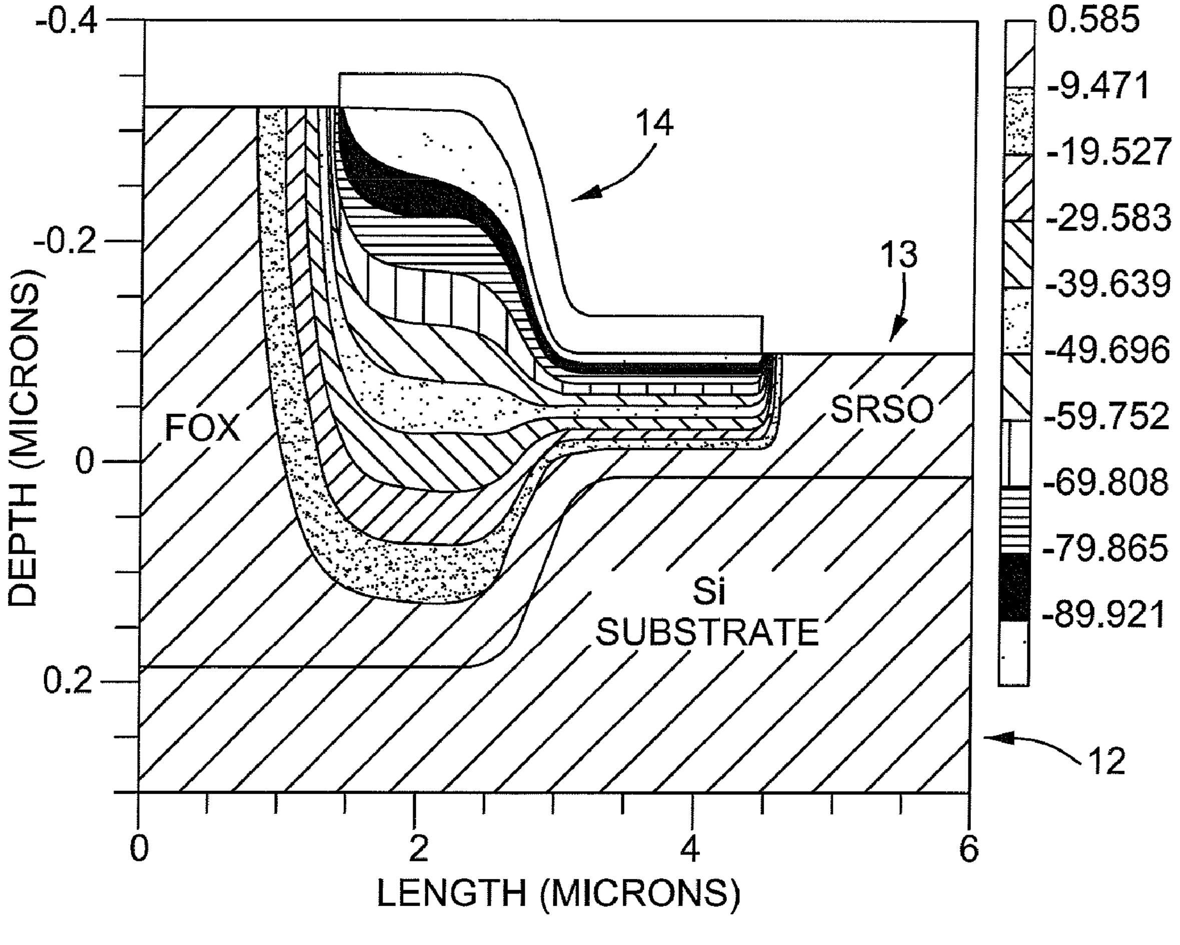
FIG. 4 illustrates the results of a two-dimensional simulation in which the edge of a transparent electrode is placed over a thin silicon rich silicon oxide layer and a thick, field oxide (FOX) region disposed on substrate.

The results of a two-dimensional simulation are illustrated in FIG. 4, in which the edge of the transparent electrode 14, e.g. indium tin oxide (ITO), is placed over a thin, e.g. 0.05 um to 1.0 um, silicon rich silicon oxide layer 13 (SRSO) and a thick, e.g. 0.5 um to 5 um, field oxide (FOX) region disposed on substrate 12. The inner edge of the ITO electrode 14 causes an enhanced concentration of the electric field over the thin SRSO oxide layer 13. Conversely the outer edge of the ITO electrode 14, which is over the thick field oxide region (FOX), exhibits potential contours that are more spread out indicating a reduction in the electric field at the outer edge of the ITO electrode 14. The spreading is due to the increased thickness of the field oxide FOX region. Accordingly, when the ITO electrode 14 is terminated directly on the SRSO layer 13, the field at the edge is very high, but when the ITO electrode 14 is terminated on top of the FOX region, the field at the edge is much lower. Simulation shows effect of field oxide on ITO edge electric field. ITO electrode is biased at 100 V, E field=10 Mv/cm.

Figure 5A:
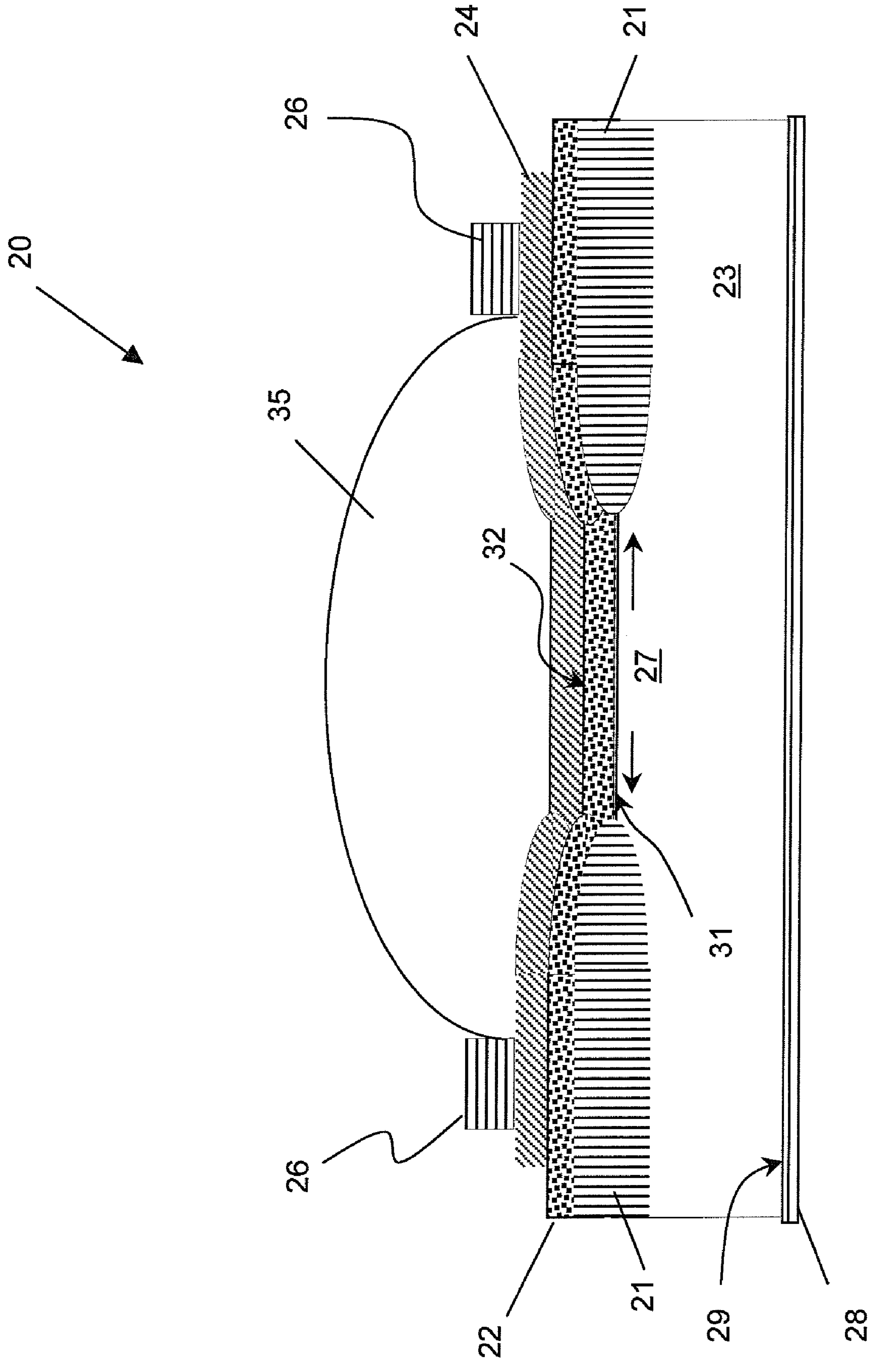
FIG. 5*a* is a side view of a light emitting device according to the present invention.

Accordingly, with reference to FIG. 5*a*, the incorporation of a thick field oxide (FOX) region 21 in a light emitting device structure 20 according to the present invention, is advantageous in producing a device that is more efficient than a simple planar device. As above, an active layer structure 22 of a single or multiple active layers with luminescent centers, e.g. rare earth oxides in a silicon dioxide ($SiO_2$) matrix or other suitable material, is deposited over the FOX region 21 and a substrate 23. The substrate 23 can be a 0.001 Ω-cm n-type silicon substrate with a work function of 4.05 eV, although any suitable substrate material will suffice. A transparent electrode layer 24 is disposed on top of the active layer structure 22. The transparent electrode layer 24 can be any suitable material including the aforementioned indium tin oxide (ITO) or other transparent conducting oxide (TCO). The opposite ends of the transparent electrode layer 24 are terminated on top of the FOX regions 21 eliminating any electric field crowding that could lead to edge related breakdown. Ideally the active layer structure is between 0.2 μm and 1 μm thick, while the field oxide layer 21 is between 1 μm and 5 μm thick, and the TCO layer 24 is between 0.3 μm and 0.5 μm thick. As above, the field oxide layer 21 is preferably 1 to 25, more preferably 2 to 10, and most preferably 4 to 6 times thicker than the active layer structure 22.

Figure 5B:
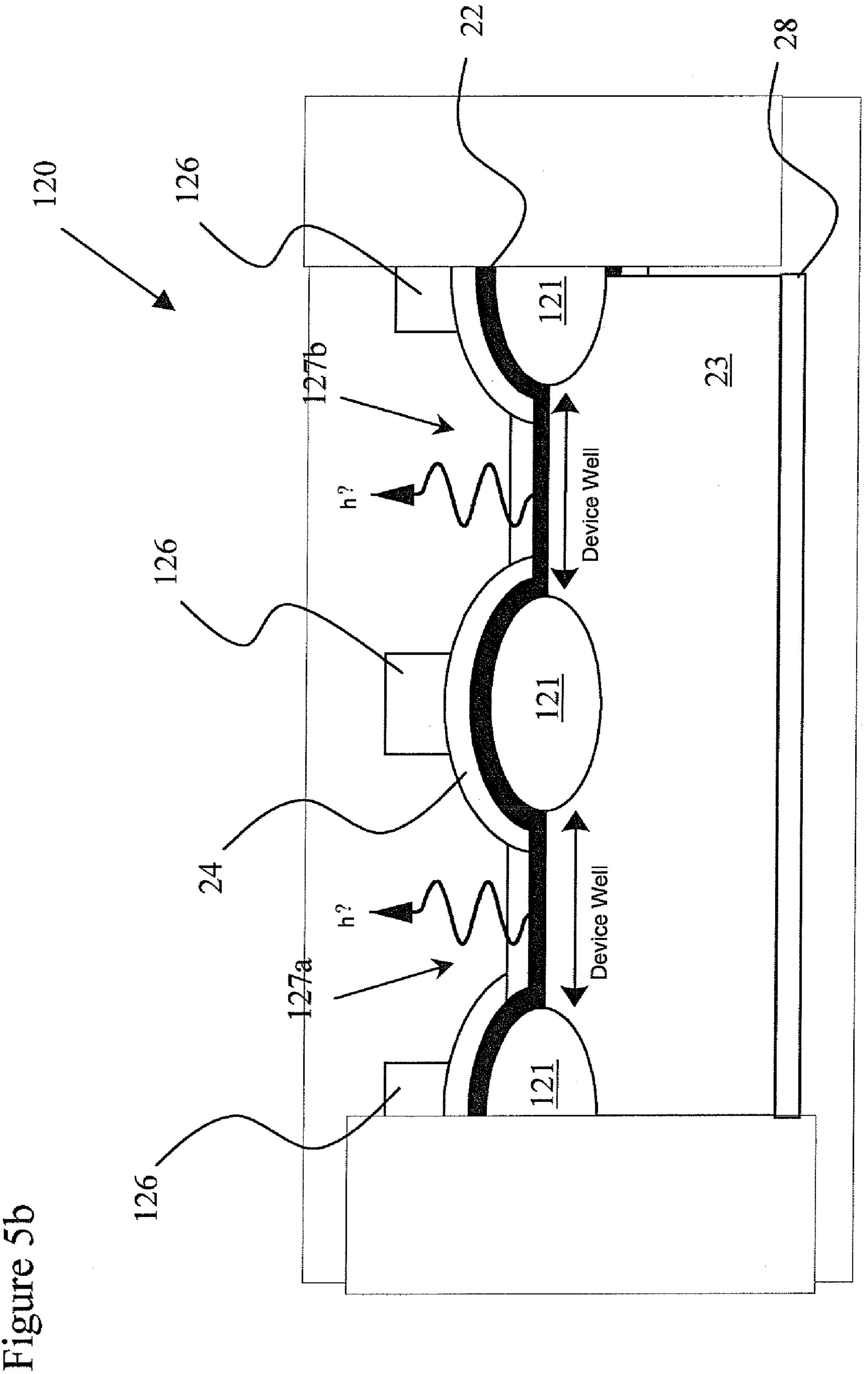
FIG. 5*b* is a side view of a micro-paneled light emitting device according to the present invention.

All metal interconnects and contacts 26 should be placed up on, e.g. directly overtop of, the thick field oxide region 21 as is indicated in FIGS. 5*a* and 5*b*. Any area with metal, e.g. metal contacts 26, covering the active layer structure 22 will not be able to emit light therethrough, and therefore the light is scattered away in different directions and effectively lost. As a result current that is injected in the region below the metal contacts 26 is also wasted, and reduces the external efficiency of the system as it does not contribute to any useful light output. By placing the regions of the active layer structure 22, which are below the metal contacts 26, on the thick field oxide regions 21, there is no current injection into the active layer structure 22 directly under the metal contacts 26 as the underlying thick field oxide regions 21 represents a barrier to current flow. Accordingly, an optically active region of the active layer structure 22, wherein any current injection via the transparent electrode layer 24 contributes to the generation of light, is confined only to a device well 27, between the FOX regions 21.

As above, a bottom contact layer 28 is provided for generating an electric field with the upper metal contacts 26 and the TCO layer 24. To maximize light emissions in one direction, a reflective layer 29 can be coated or deposited between the active layer structure 22 and the bottom contact layer 28 to reflect any light back towards the device well 27. Moreover, transition layers 31 and 32 can form part of the active layer structure 22 providing set back layers for the interfaces of the active layer structure 22 with the substrate 23 and the transparent electrode layer 24, respectively, as hereinbefore described.

When using AC biases, total device capacitance can make measurements of the real tunneling current difficult due to the displacement current associated with the device capacitance. To reduce this effect, placing the metal contacts 26 up on the field oxide layers 21 will reduce the parasitic capacitance associated with the region therebetween, minimizing the total device capacitance. As the field oxide layers 21 are relatively very thick, e.g. 2 to 10 times, preferably 4 to 6 times, relative to the optically active layer 22, e.g. Rare Earth, whereby the field oxide capacitance per unit area, $C_{FOX}$, is significantly smaller than $C_{RE}$. Accordingly, the total capacitance is simply the series combination of $C_{FOX}$ and $C_{RE}$, which results in a reduction of the total device capacitance and the magnitude of the measured displacement current.

Encapsulant Layer

To improve the extraction efficiency of the device 20, an encapsulant layer 35 is disposed over the device well 27. The encapsulant 35 is made from a material having a refractive index closely matched to the refractive index of the active layer structure 22, thus substantially eliminating total internal reflections at the light emitter/encapsulant interface without the need for special surface treatments. An example of such a materials system is a silicon-rich silicon oxide (SRSO) as the active layer 22, coupled with an optical epoxy as the encapsulant layer 35. Both the active layer structure 22 and the encapsulant layer 35 can be manufactured with refractive indices in the range of 1.4 to 1.7, preferably 1.5 to 1.6 and so with the appropriate production control can be matched very closely.

To minimize the amount of total internal reflections at the encapsulant/air interface, the encapsulant 35 is formed with a curved or domed upper surface, thereby acting like a lens and providing a lensing function. The domed shape enables a much greater proportion of the rays to exit the encapsulant 35 within the critical angle and thus avoid total internal reflection. In the limit, if you think about an imaginary device consisting of a sphere of encapsulant with a point light source at its exact center, then the light extraction will be 100% because all rays strike the surface normally so they won't ever be reflected no matter what the relative refractive indices are. The encapsulant 35 is shaped into a lens in order to maximize the amount of light extracted in the desired direction.

The encapsulant 35, in practice, would be a transparent epoxy that is manufactured specifically for the purpose of making light-emitting devices 20, and has been developed with a chemistry and other characteristics that fit the application with an index of refraction between. But notionally any clear material could be used—the only operative feature that is relevant to this invention, other than transparency of course, is the refractive index. It could be a blob of transparent gel, or any material at all actually, provided it's clear and it has the right refractive index.

In order to obtain an overall efficiency that is practically useful, the active layer structure 22 must be constructed in such a way that it can generate light with a practical level of efficiency, whereby it becomes possible to engineer devices with an overall efficiency, without back reflector, in the range of 30% to 40%, with a theoretical maximum of 50% or 100% with a back reflector, which is at least double the efficiency obtainable with previously available materials systems.

Figure 5C:
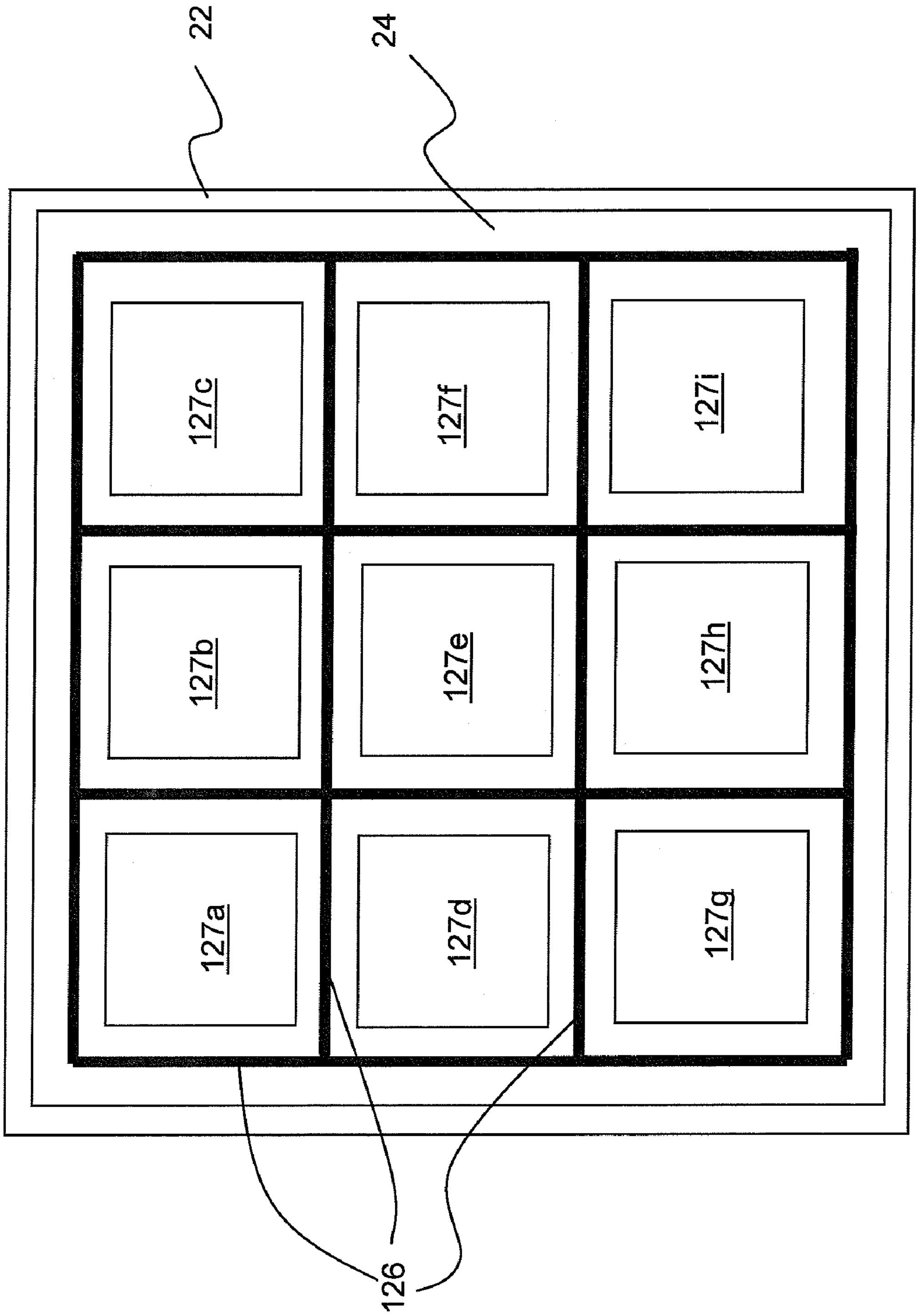
FIG. 5*c* is a top view of a micro-paneled light emitting device of FIG. 5*b;*

With reference to FIGS. 5*b* and 5*c*, light emitting devices including a thick field oxide layer 21 do not necessarily allow for the formation of arbitrarily large area pixels. For example, asperities or non-uniform film thicknesses caused from the deposition techniques can result in localized increases in the electric field under bias in the active layer 22 leading to the formation of breakdown spots or hot spots in the bottom of the active device well 27. At low excitation power levels, these planar breakdowns that take place in the active layer 22 of the light emitting device 20 well tend to be of the self healing type. As the bias across the light emitting device 20 is increased, a breakdown or a hot spot forms, (where it is believed that the current on a microscopic scale increases suddenly) which leads to a rupture of the dielectric properties of the emissive active layer 22 and a large amount of energy stored in the cables, connecting the light emitting device 20 to a power source, is suddenly released. As a result, the emissive active layer 21 and the TCO layer 24 in the immediate surrounding area are vaporized and a crater is left behind. The defect that was the site of the initial breakdown/rupture has also been removed and ejected by this process and the pixel is found to continue to operate until the bias is increased and the next weakest point in the active layer film 22 is found and the process repeats itself.

This mode of breakdown is a self healing type. If the bias is large enough, when there is a rupture of the emissive active layer 22 in a large area pixel, the breakdown will cease to be self healing and will become propagating in nature. In this mode, it is found that the breakdown will continue with a burning action/arc in which the emissive active film 22 and the TCO layer 24 in effect burn up. If left unchecked, this burning can continue with the near complete consumption of the entire active area in the device well 27 unless the current to the device 20 is terminated. While observing the spectrum of a device as it fails, two very bright lines appear at 452 nm and 410 nm and have been identified as originating from singly ionized Sn and In respectively[i]. If the bias is reduced or the current terminated, the burning action and the observed spectrum also disappear and the damage is stopped. This indicates that an energy source, such as the applied bias, is required to drive this propagating breakdown phenomenon it is not self sustaining.

With particular reference to FIG. 5*b*, to overcome the problems with large area emitting structures, such as propagating breakdown, the total emitting area of the layered light emitting active layer film structure 22 of a light emitting device 120 is subdivided into smaller area micro-panel emitters or wells, e.g. 127*a* to 127*i*, that are laterally isolated from one another by the presence of thick field oxide regions 121. The presence of the thick field oxide regions 121 between adjacent micro-panels, e.g. 127*a* to 127*i*, serves to electrically isolate the light emitting active layer structure 22 and the upper electrode 21 from the underlying substrate 23, whereby connections to metal contact power buses 126 can be made to the upper electrode 21 without resulting in a breakdown directly under the metal contact power buses 126. Secondly the thick field oxide regions 121 serve as a barrier to disrupt the propagating nature of a high bias failure. In the embodiment illustrate in FIG. 5*c*, the metal contact power buses 126 and the field oxide regions 121 each form a grid pattern of parallel and perpendicular sections, with the active layer structure 22 and the TCO layer 24 sandwiched therebetween. The parallel and perpendicular sections of the field oxide regions 121 are directly below the parallel and perpendicular sections of the metal contact power buses 126, whereby regions of the active layer structure directly therebetween define covered sections, which are void of current injection, surrounding the light emitting sections, i.e. the wells 127*a* to 127*i*. The wells 127*a* to 127*i* can be defined by a plurality of straight or curved metal contact power buses sections 126 with corresponding shaped field oxide sections 121, and take the form of any shape; however, substantially rectangular or square shaped wells 127*a* to 127*i* are the most practical from a manufacturing stand point.

The width of the field oxide regions can be as wide as one would like to make them, as there is no real limit associated with the formation thereof. Practically speaking if the emitter is not very bright, the emissive area density high should be kept high, so the field oxide width would be kept to an absolute minimum. If on the other hand the emissive area is very bright, the total emissive area should be reduced to conserve power and so the pixels could be spaced quite far apart. Well portions being 5 microns to 5000 microns, 15 microns to 1000 microns, 20 microns to 500 microns, 20 microns to 200 microns are all reasonable.

To construct the EL devices 20 or 120, the micro-panel emitters, e.g. 27 or 127*a* to 127*i*, are patterned and the thick field oxide regions 21 or 121 are grown using a LOCOS technique. Alternatively, a thick field oxide layer can be grown over the substrate 26 and then etched back to the bare substrate 26 defining the thick field oxide regions 21 or 121. As a result of either initial step, device wells 27 or 127*a* to 127*i* are formed surrounded by the thick field oxide regions 21 or 121, respectively, to provide lateral isolation from adjacent device wells. Subsequently, the layered light emitting film structure 22, is deposited using any suitable technique, e.g. sputtering, spin on, LPCVD, PECVD, ALE, MOCVD, or MBE techniques. The layered light emitting film structure 22 is deposited as a blanket layer or multi-layer structure over top of a plurality of device wells, i.e. micro-panels 127*a* to 127*i*, and a plurality of field oxide regions 21 or 121 requiring no patterning and etching as isolation between micro-panel, e.g. 127*a*, to micro-panel, e.g. 127*b*, is provided by the thick field oxide regions 121. The upper and lower electrodes 21 and 28 are then deposited as blanket layers, again using sputtering, spin on, LPCVD, PECVD, ALE, MOCVD, or MBE techniques. The upper electrode 21 is conductive and forms the upper contact electrode for all of the micro-panels, e.g. 127*a* to 127*i*, simultaneously. Lateral isolation between adjacent micro panels, e.g. 127*a* to 127*i*, is provided by the thick field oxide regions 121. A schematic representation of the micro-paneled structure is shown in FIG. 5*b*, in which the thick field oxide regions 121 separate two device wells, i.e. micro-panels 127*a* and 127*b*. In a large area emitter, there would be many hundreds or even thousands of the micro-panels 127*a* to 127*i*, arranged in a larger array.

Once a propagating breakdown event is established in a micro-panel, e.g. 127*a* to 127*i*, the burn front will move to consume both the layered light emitting film structure 20 and the upper electrode layer 21 laterally as long as the current source to the devices is maintained. As the burn front approaches the edge of the device well, i.e. the micro-panels 127*a* to 127*i*, it will start to travel up and out of the device well as both the layered light emitting film structure 20 and the upper electrode 21 are continuous on top of the thick field oxide regions 121. When this happens, the impedance of the arc will start to increase and there will be a tendency for the arc to self extinguish as the arc is established between the upper electrode 21 and the substrate 23. The extinguishing of the arc is due to the reduction of the electric field across the emissive layer stack of the upper electrode 21 as the burn front moves up the thick field oxide region 121 and away from the substrate 23. Accordingly, the inclusion of the thick filed oxide regions 121 between adjacent micro-panels 127*a* to 127*i* causes a propagating breakdown event to become an isolated event that is localized in the originating micro-panel. The breakdown event is effectively isolated by the presence of the thick field oxide regions 121 rendering the rest of the micro-panels in the large area array largely unaffected where they continue to operate under bias, whereby the thick field oxide regions 121 provide a built in self limiting mechanism by which propagating breakdowns are terminated without adjusting the bias current.

There are additional benefits to designing large area emitters as a micro-paneled device. Most importantly, the metallization interconnect that supplies power via the upper electrode 21 to reduce spreading resistance and parasitic resistance effects associated with the upper electrode 21 can be run along the upper electrode 21 on top of the thick field oxide regions 121, whereby the capacitance associated with the metallization interconnect is minimized and the metal does not eclipse any light generated.

Example Process

Figure 6:
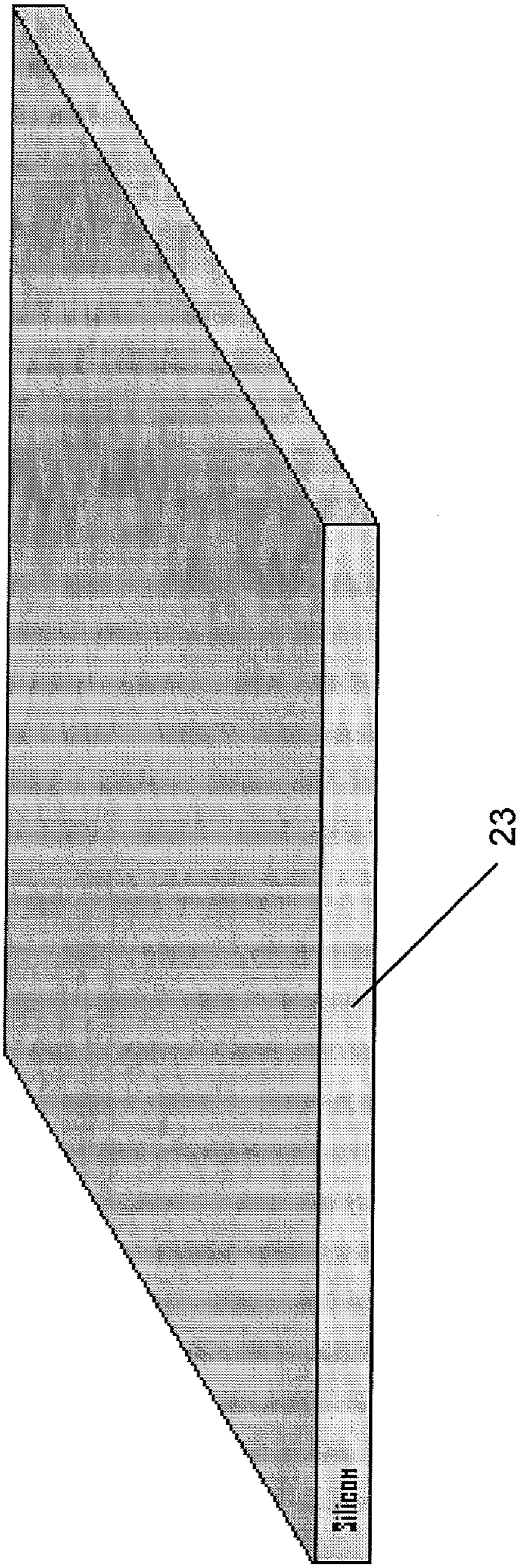
FIGS. 6 to 18 represent manufacturing steps for the device of FIG. 5.
Figure 7A:
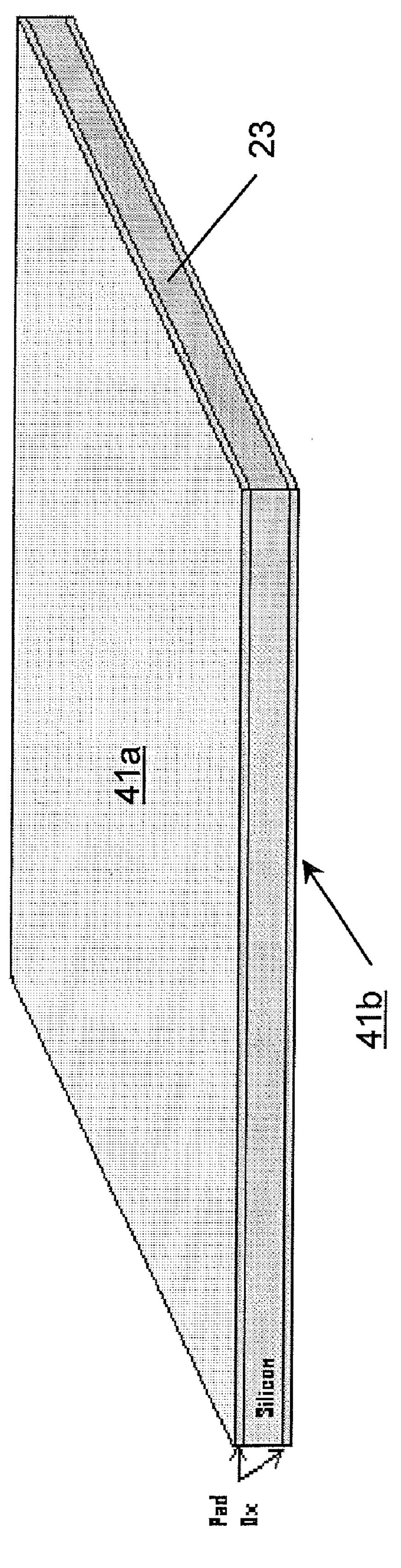
Figure 7B:
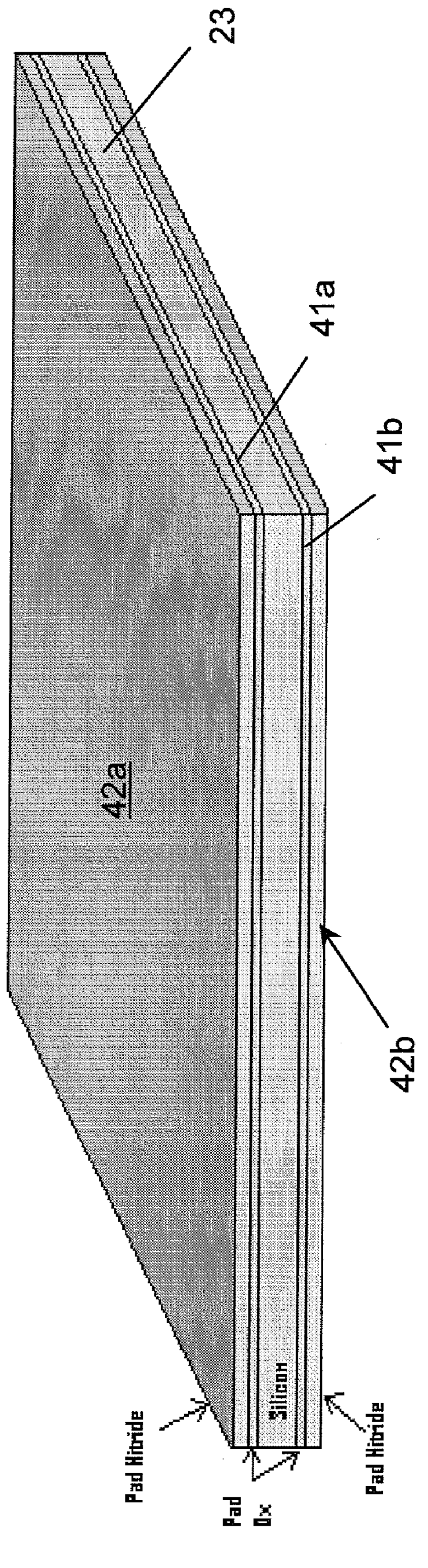

With reference to FIGS. 6 to 18, the manufacturing process according to the present invention begins with the substrate 23 (FIG. 6). Pad oxide layers 41*a* and 41*b*, approximately 500 Angstroms thick, are thermally grown on opposite sides of the substrate 23 by dry oxygen thermal oxidation to protect the substrate during subsequent steps, e.g. to electrically isolate metal contacts from the substrate 23 (FIG. 7*a*). Nitride layers 42*a* and 42*b*, e.g. silicon nitride, approximately 900 Angstroms thick, are deposited over the pad oxide layers 41*a* and 41*b* by a suitable deposition technique, e.g. LPCVD (FIG. 7*b*).

Figure 8:
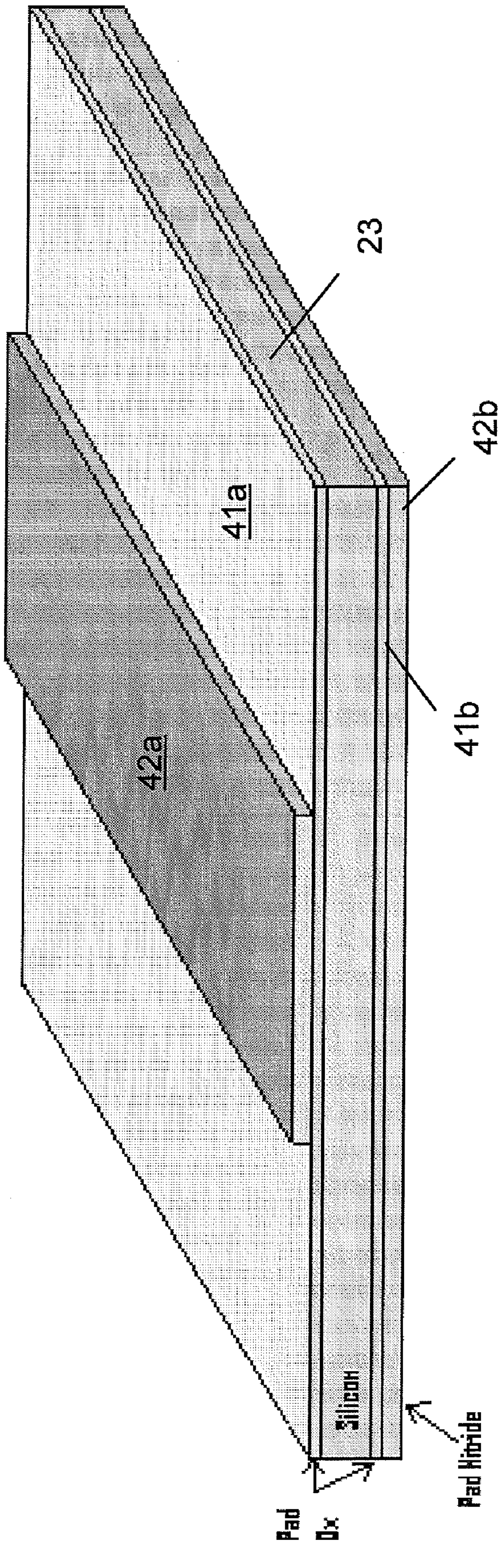
Figure 9:
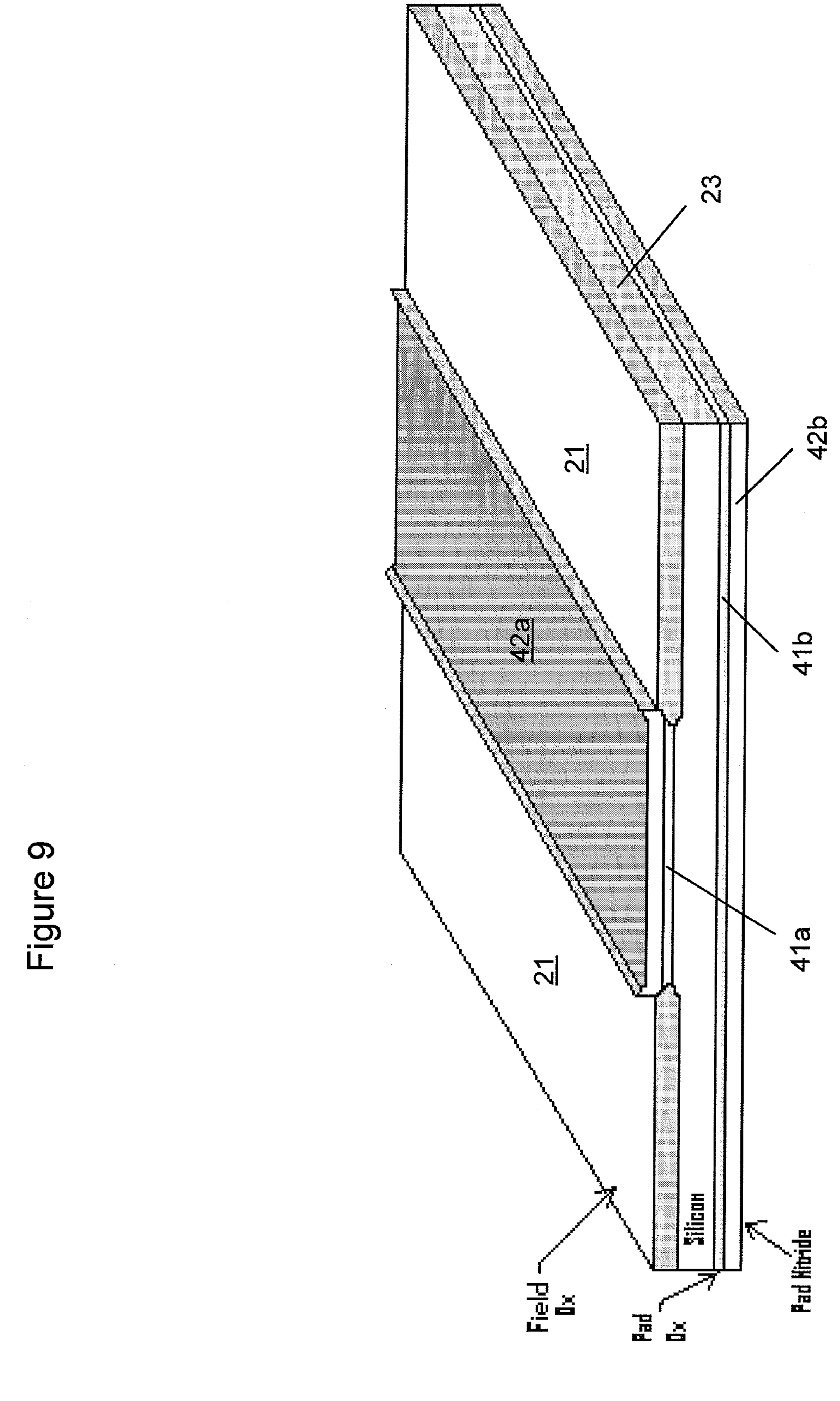
Figure 10:
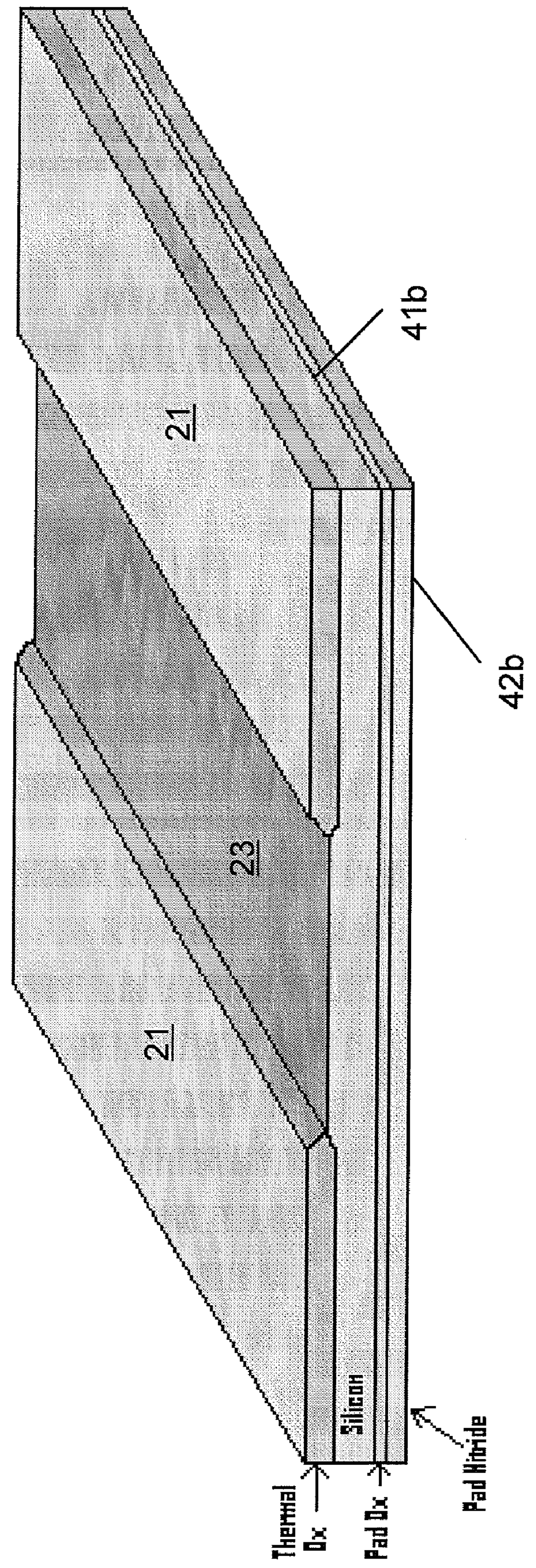

In FIG. 8, the top nitride layer 42*a* is patterned on opposite sides thereof and plasma etched down to the pad oxide layer 41*a* leaving only a central strip. The field oxide regions 21 are grown in the opened areas on opposite sides of the central strip of the pad oxide layer 41*a*. Preferably, 1 μm of the thermal oxide making up the field oxide regions 21 are grown using a pyrogenic steam furnace (FIG. 9). Any oxidized nitride from the central strip of the nitride layer 42*a* is removed in a short wet etch, and then any remaining nitride from the nitride layer 42*a* is removed from the central strip by a short plasma etch. The remaining pad oxide layer 41*a* is then removed from the central strip by a wet etch in preparation for the deposition of the active layer structure 22 (FIG. 10).

Figure 11:
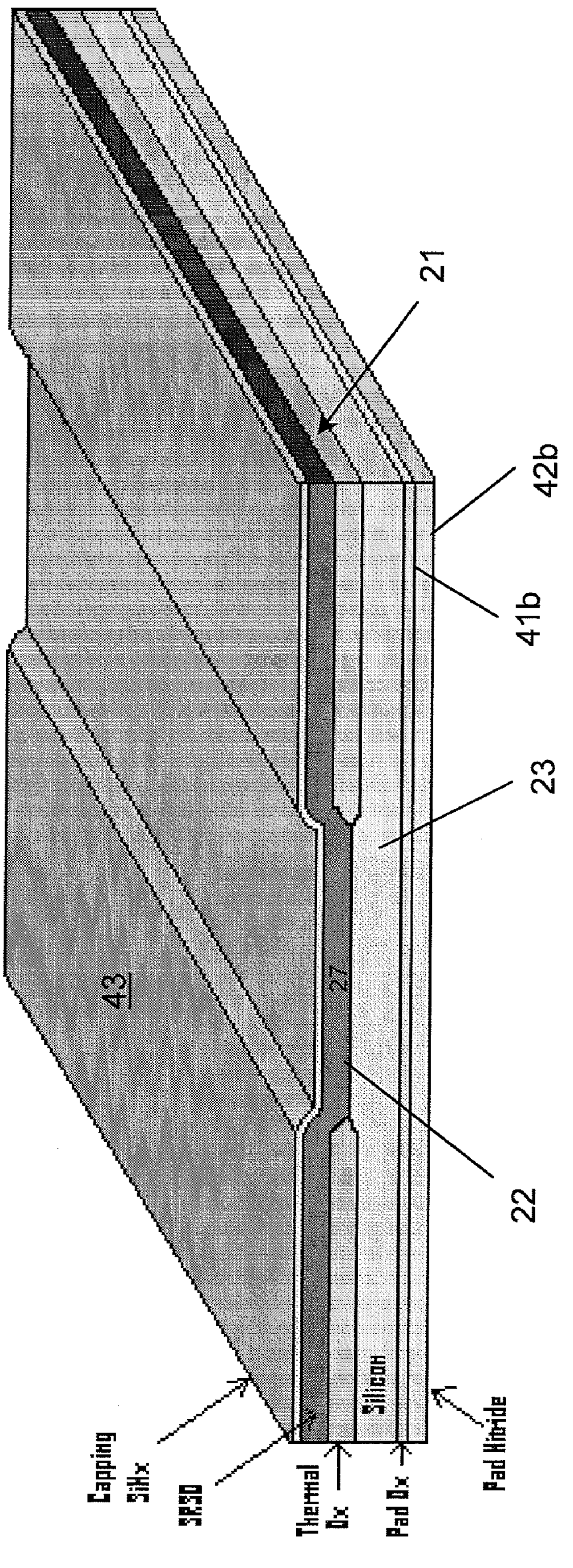
Figure 12:
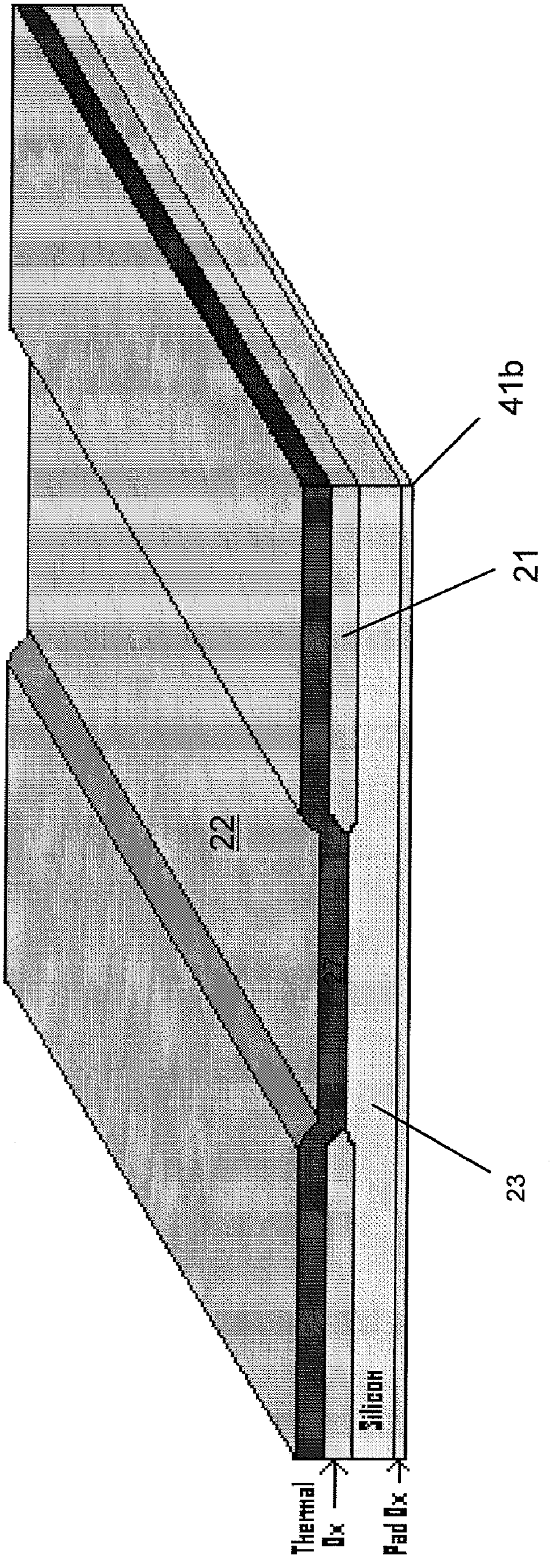

FIG. 11 illustrates the deposition of the active layer structure 22 over the field oxide regions 21 and into the device well 27 forming a naturally sloped field oxide transition, i.e. the inner edges of the field oxide regions 21 (adjacent the device well 27) are tapered substantially to a point with a sloped upper surface. The naturally sloped FOX transitions serve two purposes. First they allow for good step coverage. If the edge of the FOX regions 21 at the device well 27 was a vertical step, e.g. 1 micron high, any subsequent thin film layer, such as a bottom layer of the optically active layer structure 22 would have to be at least 1 micron thick just to make it over the vertical step. Such a thick film would require very large voltage for operation. By having the transition sloped, a much thinner film can be deposited and the continuity of the film is maintained over the step. Second, since the oxide gets gradually thicker as you move from the bottom of the device well 27 and up onto the field oxide region 21, there is a gradual reduction of the vertical electric field between the TCO 24 and the substrate 23. As a result, there is no field crowding that could lead to breakdown in the active layer structure 22.

Figure 13:
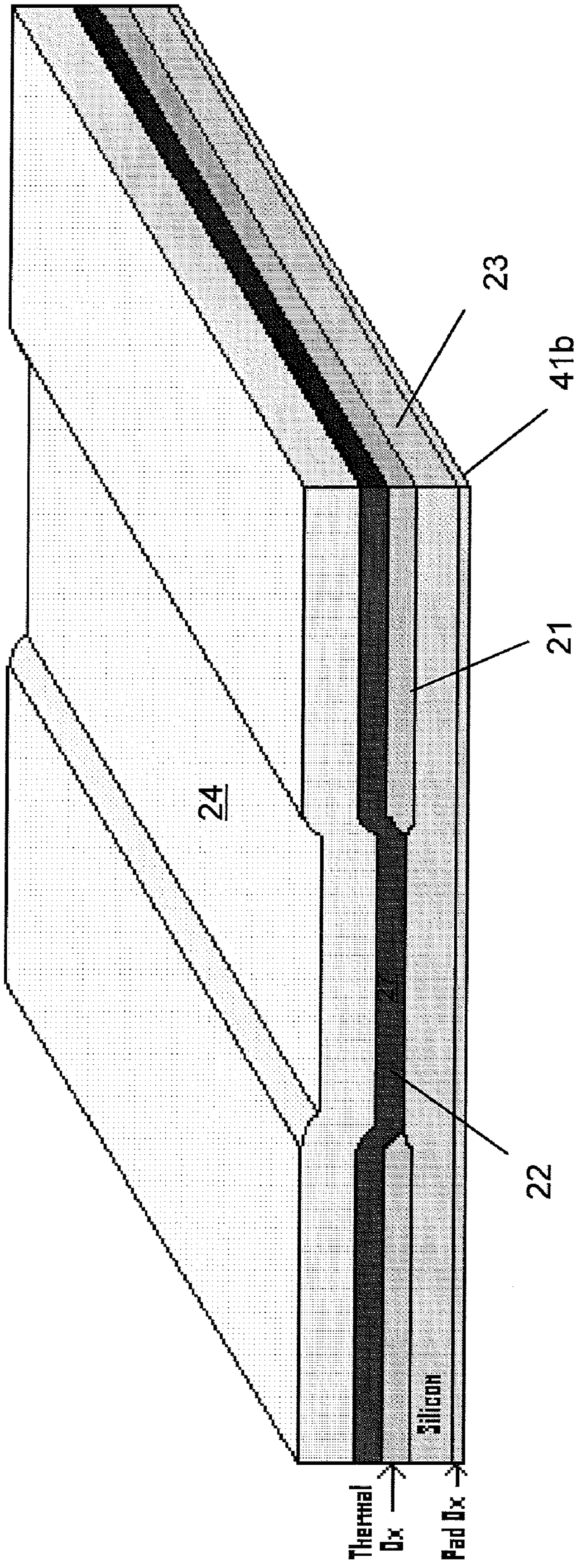
Figure 14:
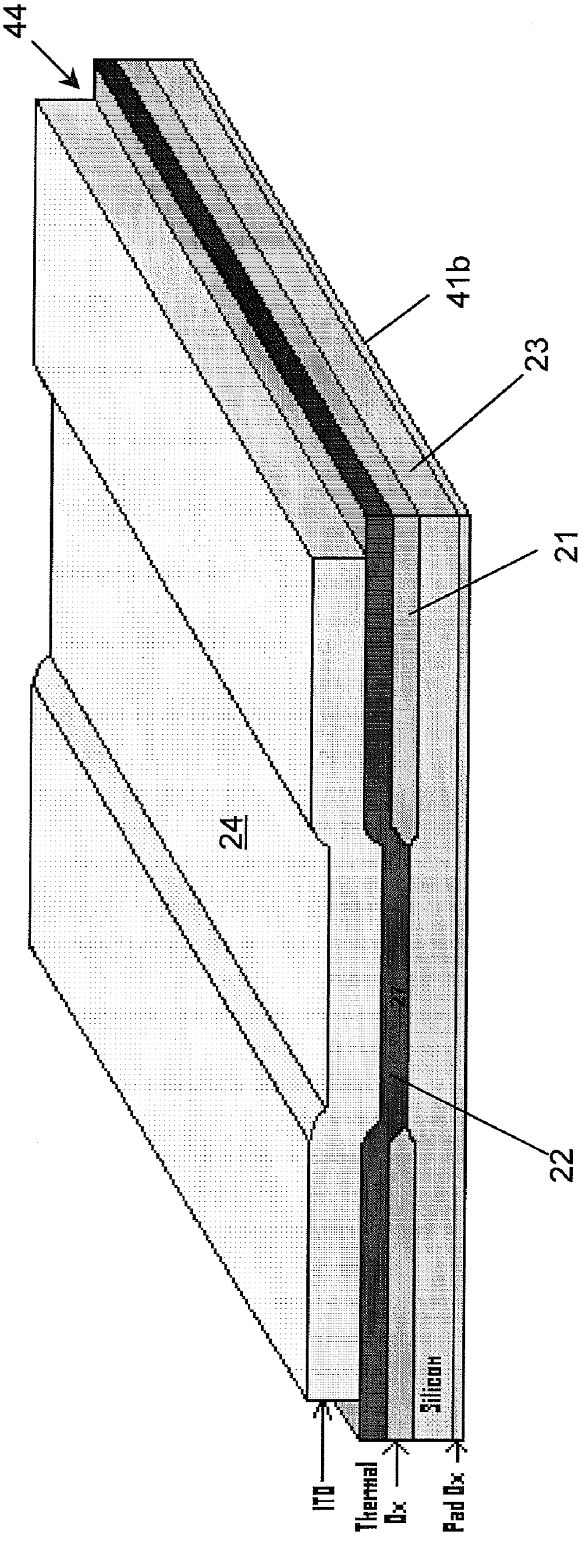
Figure 19:
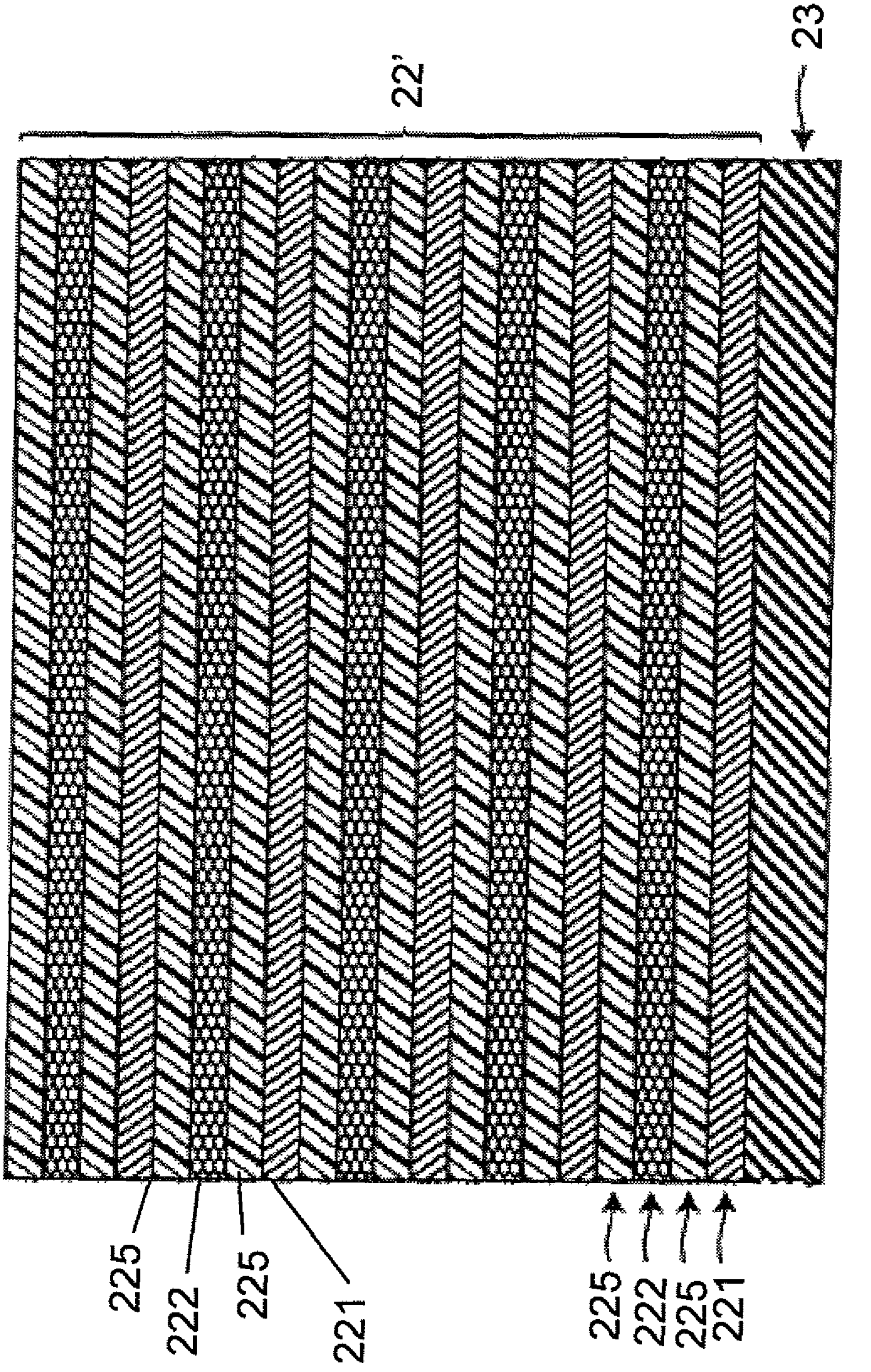
FIG. 19 illustrates an embodiment of an active layer structure of the device of FIG. 5.
Figure 20:
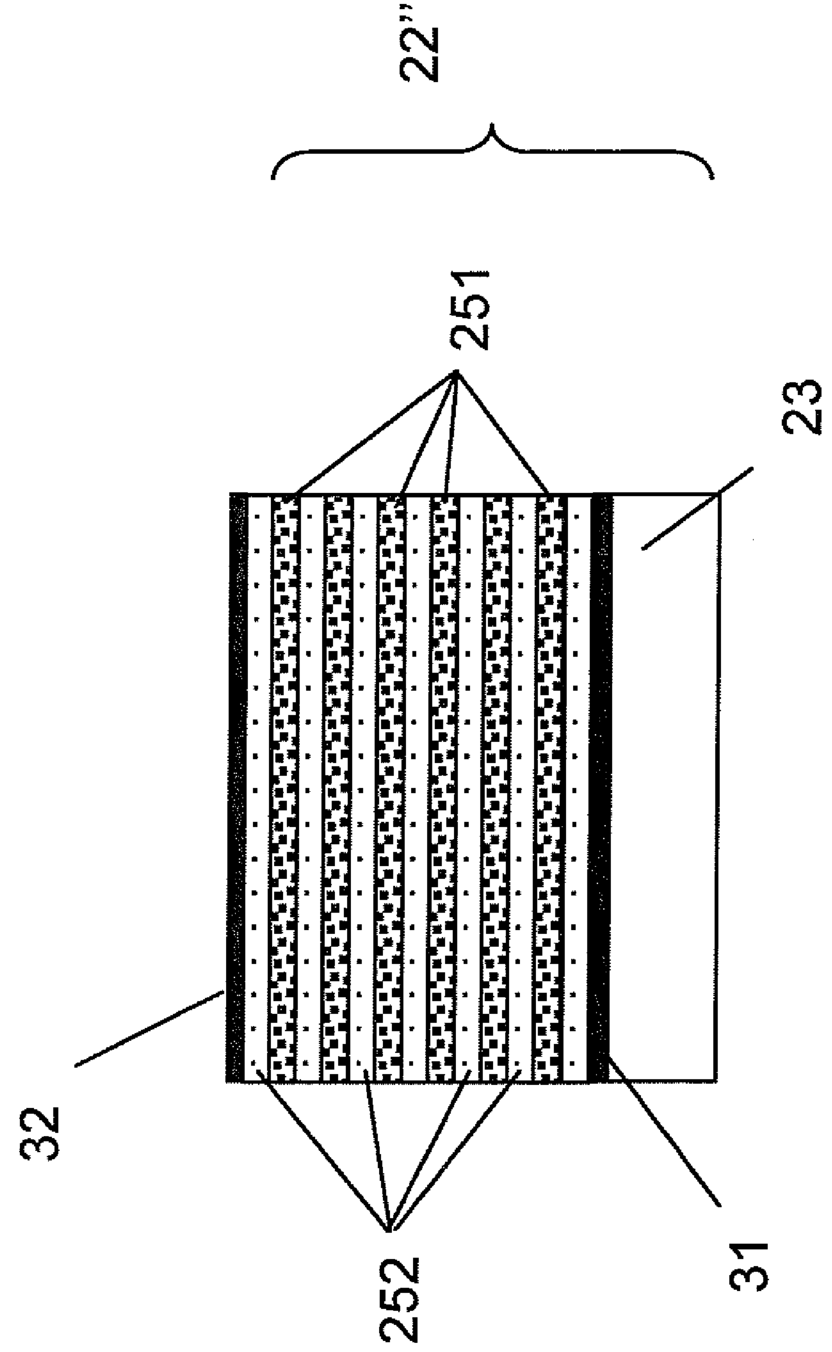
FIG. 20 illustrates an alternative embodiment of an active layer structure of the device of FIG. 5*a* or 5*b;*
Figure 21:
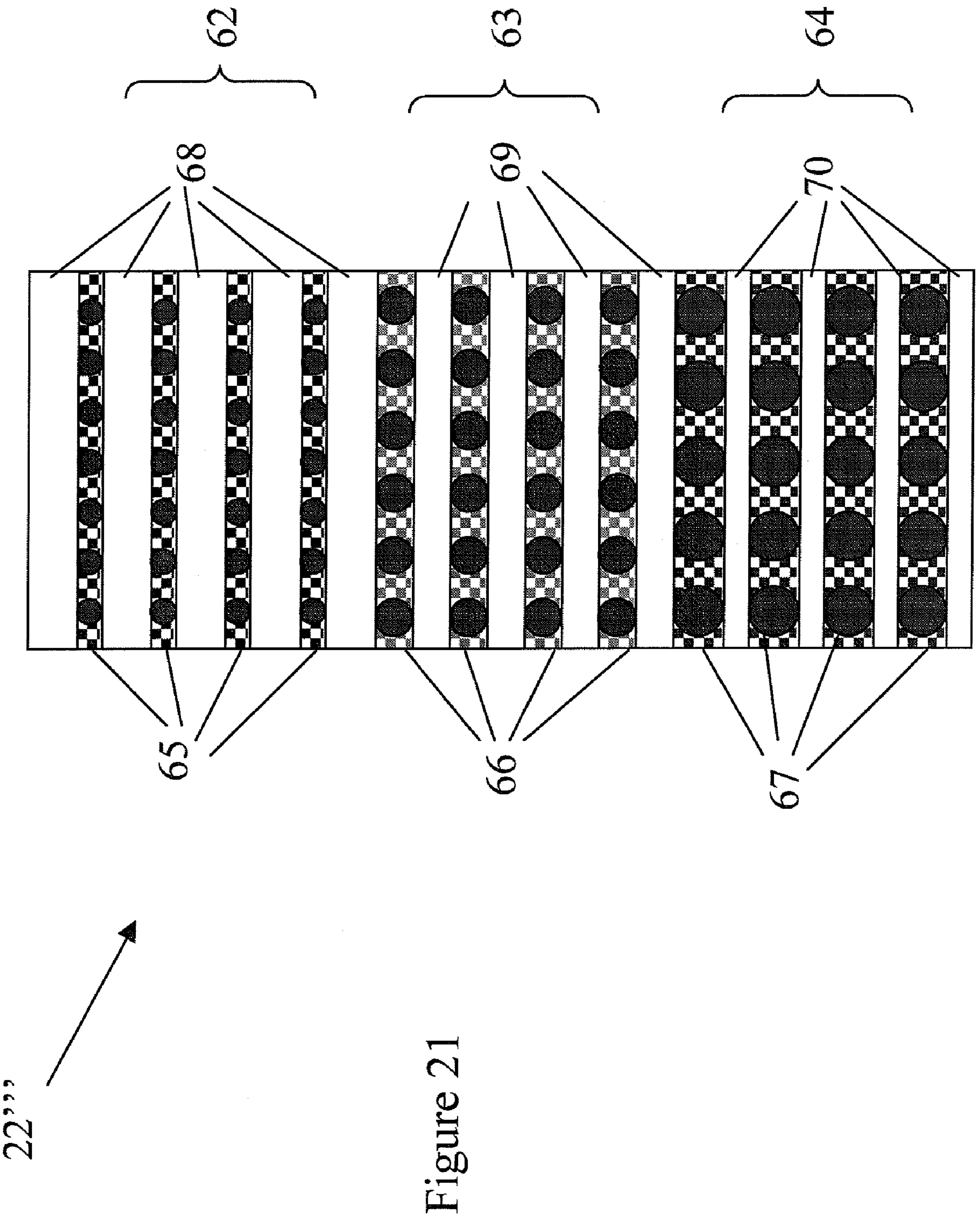
FIG. 21 illustrates an alternative embodiment of an active layer structure of the device of FIG. 5*a* or 5*b*.

The active layer structure 22, as defined above with reference to FIGS. 3 and 5 and below with reference to FIGS. 19 to 21, is typically 0.05 μm to 1.0 μm thick and can include one or multiple active layers, with transition layers 31 and 32 on either side thereof. A nitride capping layer 43, e.g. Silicon nitride, approximately 300 Angstroms thick, is deposited over the active layer structure 22 by a suitable deposition method, e.g. PECVD, which is used to protect the active layer structure 22 from inadvertent oxidation of the semiconductor nano-particles during the high temperature anneal. After the high temperature anneal, both the nitride capping layer 43 and the original bottom nitride layer 42*b* are removed (FIG. 12) The transparent electrode layer 24 is deposited on top of the active layer structure 22 including over top of the field oxide regions 21 and the device well 27 (FIG. 13). Preferably, the transparent electrode layer 24 undergoes an annealing step, e.g. in air, which results in a much higher resistivity uniformity and a resistivity drop. Moreover, the annealing step provides a more consistent etch performance and smoother etch profiles, applicable in the next step.

Figure 15:
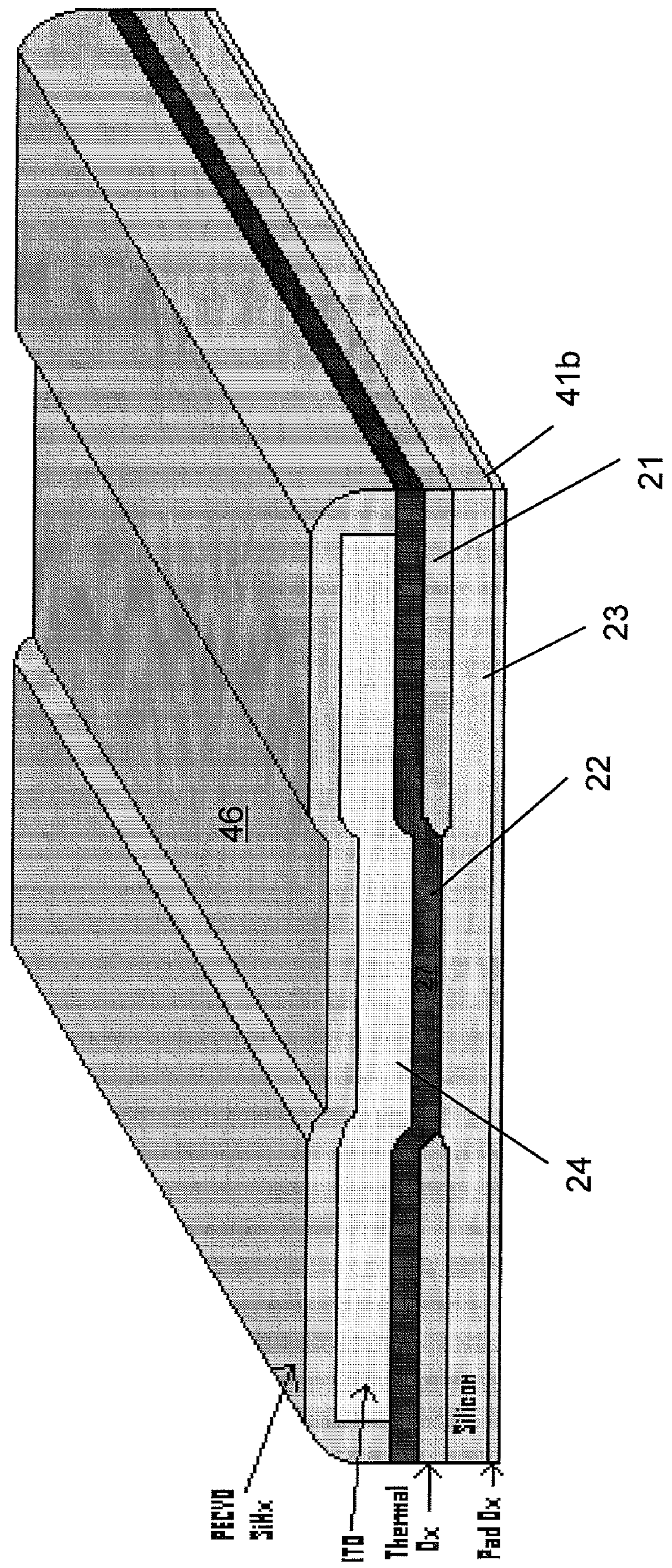
Figure 16:
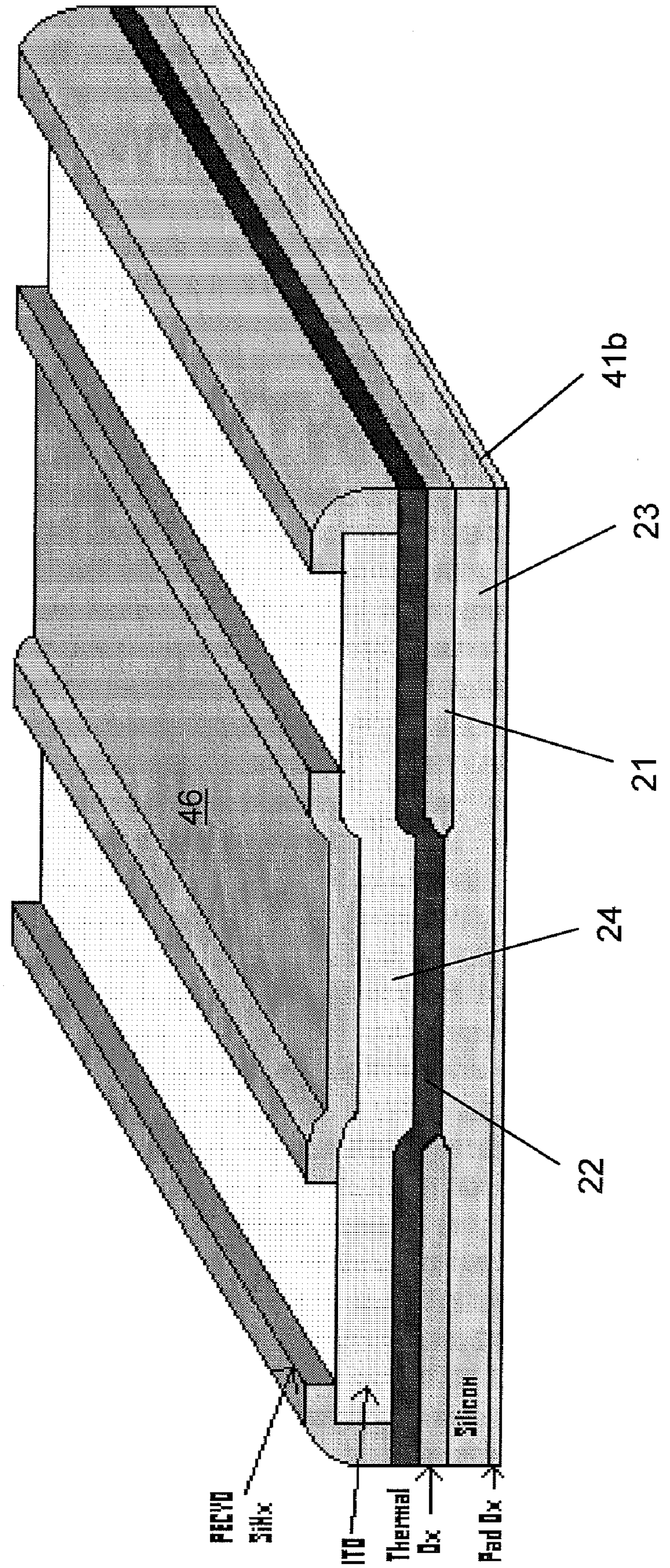
Figure 17:
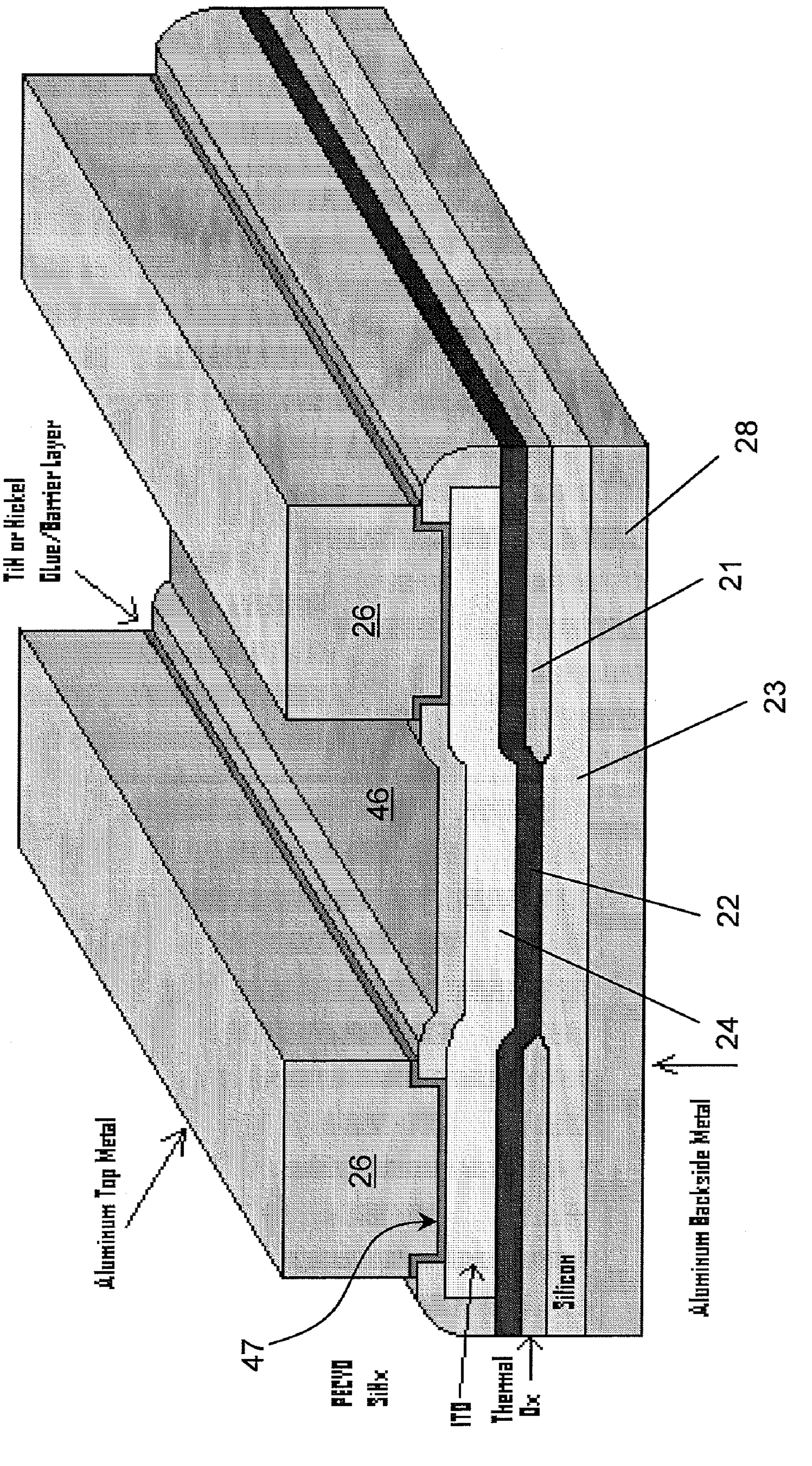
Figure 18:
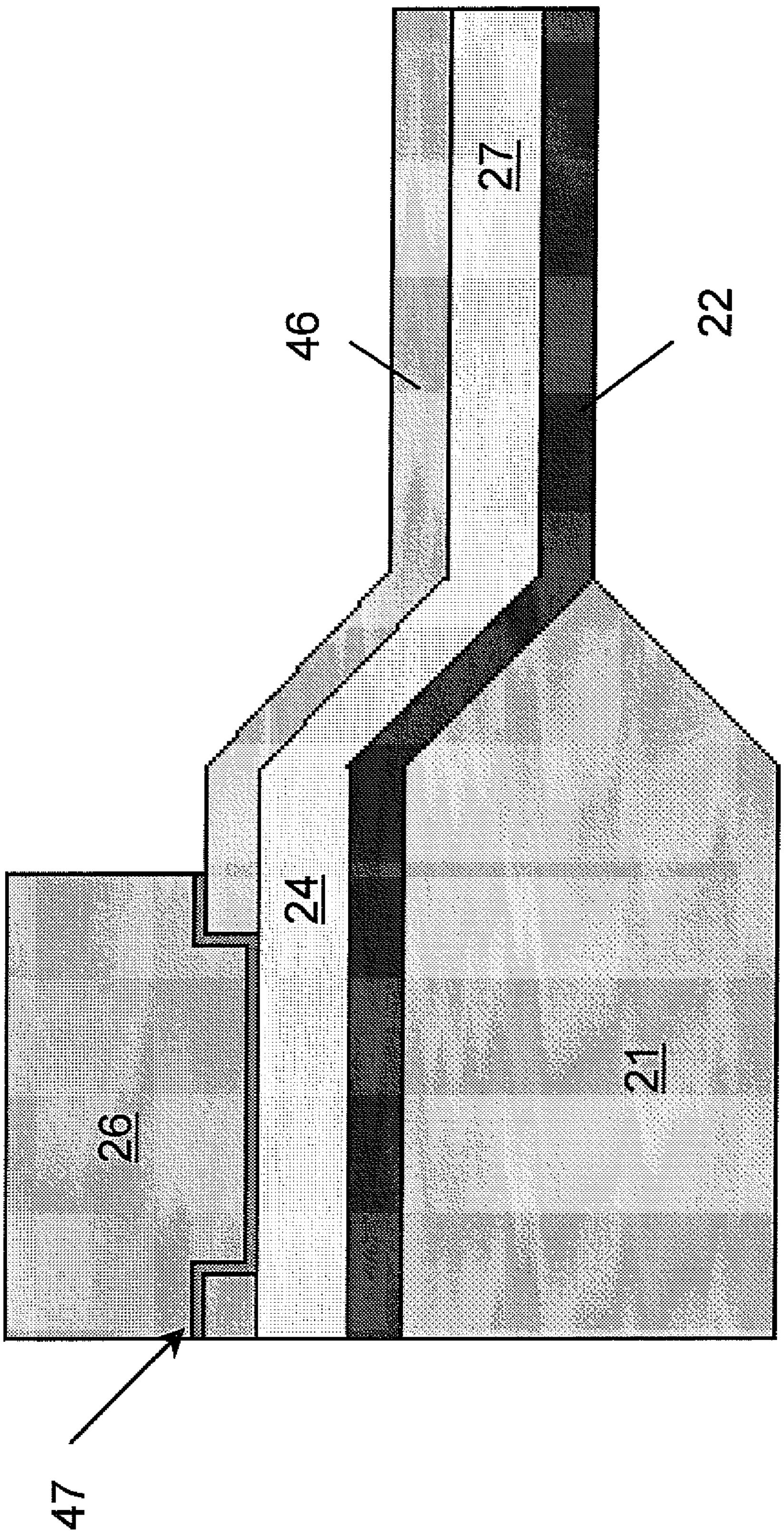

A strip of the transparent electrode layer 24 are removed, i.e. etched away, from opposite edges thereof creating shoulders 44 (FIG. 14) and providing lateral isolation of the device. Next, another nitride layer 46, e.g. silicon nitride, up to 1500 angstroms thick, is deposited over the transparent electrode layer 24 filling in the shoulders 44 (FIG. 15). Strips of the nitride layer 46 over top of the field oxide regions 21, are removed, e.g. etched away, providing openings for the metal contacts 26 (FIG. 16). FIG. 17 illustrates the deposition of a TiH or Nickel glue/barrier layer 47 to the strips in the nitride layer 46 for securing the metal contacts 26 therein. The bottom pad oxide layer 41*b* is removed prior to the fixation of the bottom metal contact 28, e.g. Aluminum contact. The reflective coating 29 can be placed on the bottom of the substrate 23 or on the bottom metal contact 28 prior to attachment thereof.

One type of preferred layered light emitting film structure 22', provided by an embodiment of the present invention, is a multi-layered emitter structure, shown by way of example in FIG. 19, which structure comprises multiple active layers 221 and 222, e.g. terbium in a silicon dioxide matrix, with wide bandgap semiconductor or dielectric buffer layers 225, e.g. silicon dioxide, otherwise known as "drift" or "acceleration"

layers, deposited on the substrate 26. Each of the active layers 27 and 29 has a thickness of from 1 nm to 10 μm. Each of the active layers 221 and 222 can comprise the same or different material, e.g. rare earth elements terbium and cerium, for generating the same or different wavelength of light, e.g. all of the active layers 221 emit one wavelength and all of the active layers 223 emit a second wavelength. The two wavelengths of light generated by the two sets of active layers 221 and 222 are combined together or with additional layers (not shown) to generate a desired color, e.g. white. The active layers 221 and 222 are separated by buffer layers 225, such as silicon dioxide layers. The upper transparent electrode layer 24 is deposited on top of the multi-layer film structure 22'. There is no maximum thickness for the layered light emitting film structure 22', although a thickness of from 50 nm to 2000 nm is preferred and a thickness of from 150 nm to 750 nm is more preferred depending upon the available amount of voltage.

One type of preferred active layer structure 22" provided by an embodiment of the present invention is a super-lattice structure, shown by way of example in FIG. 20, which structure comprises multiple active layers 251, e.g. semiconductor nano-particle, separated by, i.e. interleaved with wide band gap semiconductor or dielectric buffer layers 252, such as silicon dioxide, supported on the substrate 23. Each of the active layers 251 has a thickness of from 1 nm to 10 nm. The active layer structure 22" can comprise active layers 251 designed to emit different wavelengths of light, whereby the combination of the wavelengths creates a desired output light, e.g. white. The layers emitting different wavelengths, e.g. having different rare earth doping elements, can be interspersed with each other or several layers 251 emitting the same wavelength can be stacked together on top of another plurality of layers 251 emitting a different wavelength. There is no maximum thickness for the super-lattice structure, although a thickness of from 50 nm to 2000 nm is preferred and a thickness of from 150 nm to 750 nm is more preferred depending upon the available amount of voltage. Transition layers 31 and 32 can be added between the substrate 23 and bottom dielectric layer 252, and between the top dielectric layer 252 and the transparent electrode 24 (see FIG. 5*a*), respectively, for reasons hereinbefore explained.

The structures shown in FIG. 20 show adjacent layers in contact with each other without intervening layers; however, additional layers can be utilized to the extent they do not interfere with the recited layers. Therefore, the terms coating, adjacent, and in contact do not exclude the possibility of additional intervening but non-interfering layers.

In an exemplary process for the super-lattice structure 22'", the semiconductor, e.g. silicon, component of the growth process is initially set to a high value at the beginning of the deposition. The value is determined based on the desired index and hence excess semiconductor, e.g. silicon, content desired. After the appropriate thickness of the first transition layer 31 is deposited, the semiconductor component of the growth process is adjusted to the value required for the formation of a first buffer layer 252. The concentration of the semiconductor component is then alternated between the amount for the active layers 251 and the buffer layers 252 until all of the layers in the active layer structure 22'" are deposited. Once a sufficient thickness of the active layer structure 22'" has been deposited, the semiconductor component of the growth process is again increased to the high value used initially and the desires thickness of the second transition layer 32 is deposited. Once finished, the growth process is terminated and the film is suitably annealed to form the semiconductor nano-particles, e.g. silicon nanocrystals, in the active and transition layers.

By embedding small silicon nano-particles in a silicon nitride matrix, the radiative lifetime of the silicon nano-particles can approach the nanosecond and/or sub-nanosecond regime due to the effect of surface passivation of the nano-particles by nitrogen atoms, and the effect of strong coupling of electron and hole wave functions of the excitons.

Uniformly deposited $SiN_x$ films, in which silicon nano-particles formed in a silicon nitride matrix, generally have a relatively wide range of size, and a random spatial distribution, specifically the separation distances between nano-particles. In addition, silicon nano-particles formed in $SiN_x$ films may form connected small clusters when subjected to higher temperature, which would affect light emitting efficiency. This could also severely limit device processing flexibility after film deposition. A combination of variations of nano-particle size and separation distance could result in significant impact on the electro-luminescent efficiency of silicon nano-particle structures formed in such films.

In the films in which silicon nano-particles are embedded in a silicon nitride matrix, current conduction in the films might be significantly affected by the high trap density of the silicon nitride host and hence impose detrimental effects on the effectiveness of injected charge carriers to gain energy from the electrical field to create excitons in the silicon nano-particles. However, the engineered structure according to the present invention eliminates all of the aforementioned problems by providing buffer layers in between active layers of semiconductor nitride, thereby ensuring the proper distance between nano-particles. Moreover, providing thin active layers, i.e. nano-particle, size, the size of the nano-particles can be more closely controlled.

With particular reference to FIG. 21, the active layer structure 22" comprises an engineered film structure, according to another embodiment of the present invention, which is formed by a plurality of different sets 62, 63 and 64 of organized layers, in which the active layers 65, 66 and 67 are separated by buffer layers 68, 69 and 70, respectively, comprised of a pure wide bandgap semiconductor or dielectric material. For engineered film active layer structures 22'" driven by AC voltage the buffer layers 68 and 70 are disposed between the active layers 65 and 67, respectively and the electrodes 26 and 28 as the current will flow in both directions as the voltage oscillates.

The size of the nano-particles, e.g. nanocrystals, is approximately equal to the thickness of the active layer 65, 66 and 67 in which they reside. The size of the nano-particles in each active layer 65, 66 and 67, i.e. the thickness of the layers 65, 66 and 67, is designed for a specific excitation energy to produce a desired colored light emission. A theoretical relationship between nano-particle diameter d (in nanometers) and excitation energy E (in electron-volts) for silicon nanocrystals in a silicon dioxide matrix host doped with rare earth is given by:

$$E=1.143+5.845/(d^2+1.274d+0.905)-6.234/(d^2+3.391d+1.412);$$

For example, ~1.9 eV for red photons (d=2.9 nm), ~2.3 eV for green photons (d=2.1 nm), or ~2.8 eV for blue photons (d=1.6 nm). The rare earth ion species placed within or next to a nano-particle layer is selected to radiate at a wavelength matched to the excitation energy of the nanocrystals within the layer (or vice versa).

For group IV, e.g. silicon, nanocrystals in a silicon nitride matrix host without rare earth doping or for group IV, e.g. silicon, nanocrystals in a silicon dioxide matrix host without rare earth doping the excitation energy equation to generate a specific excitation energy to produce a desired colored light emission from the nanocrystals has been shown to be:

$$E=E_0+C/d^2$$

Where $E_0$=1.16 eV and C=11.8 eV-nm$^2$

Accordingly, the thickness of the red light emitting layer, i.e. the diameter of the nanocrystals in an active layer with silicon nanocrystals in a silicon nitride matrix, is 4 nm, 3.25 nm for the green layer, and 2.6 nm for the blue layer.

The thickness of the buffer layers 68, 69 and 70 are closely matched to the size of the nano-particles in the neighboring nano-particle active layers 65, 66 and 67. For an electric field applied perpendicular to the plane of the layers 65 to 70, an electron must gain sufficient energy from the applied electrical field to excite the nano-particles to the correct energy—the energy gained in the buffer layers 68, 69 and 70 (measured in eV) is equal to the electric field multiplied by the thickness of the buffer layer 68, 69 or 70. For example, for an applied electrical field of 5 MV/cm, the thickness of the buffer layer must be 3.8 nm or thicker to excite a nano-particles to 1.9 eV (1.9 eV/0.5 eV/nm=3.8 nm), 4.6 nm or thicker to excite a nano-particles to 2.3 eV, or 5.6 nm or thicker to excite a nano-particles to 2.8 eV. For engineered film active layer structures 22''' powered by ac electrical power, in which neighboring nano-particle layers, e.g. 65 and 66, emit at different wavelengths, the intervening buffer layer, e.g. 68, must be thick enough to excite the nano-particles in the higher energy layer.

The engineered film active layer structure 22''' provides a great improvement in luminous flux (optical output power), efficiency (internal power conversion efficiency and external luminous efficacy), color rendering index (CRI), device reliability and lifetime, and device manufacturability/cost/yield of solid state light emitting devices based on silicon nano-particles in a silicon oxide matrix and doped with rare earth ions and other impurities, such as carbon.

Rare earth ions may be incorporated into the active layers 65, 66 and 67, into the buffer layers 68, 69 and 70, or into both. The preferred structure incorporates rare earths only within the active layers 65, 66 and 67, with a concentration such that the efficiency of energy transfer from the nano-particles to the rare earth ions is maximized and the radiative emission efficiency of the excited rare earth ions is maximized. Due to the complexity of the physical processes involved, optimization is generally an empirical process. The rare earth ion species placed within or next to a nano-particle layer is selected to radiate at a wavelength matched to the excitation energy of the nano-particles within the layer (or vice versa).

Other impurities, if required, will typically be incorporated only within the nano-particle layers 65, 66 or 67, although they could be placed anywhere within the active layer structure 22'''. For example, since observations have determined that the measured excitation energy of a nano-particle is not as high as expected theoretically, carbon atoms may be required to raise the excitation energy of the nano-particles transferred to the rare earth ions in the wide bandgap semiconductor or dielectric, e.g. silicon oxide, matrix.

The buffer layers 68, 69 and 70 should be of the highest quality, i.e. dense with few defects, achievable with such materials, within the capabilities of a specific processing technology, whereby the device lifetime and reliability under a high applied electric field will be maximized.

Silicon-rich silicon oxide, with or without carbon and rare earth doping, for the active layers 65, 66 and 67, and silicon dioxide for the buffer layers 68, 69 and 70 are the preferred materials in the engineered film structure. Other material systems, such as silicon-rich silicon nitride with or without rare earth doping for the active layers 65, 66 and 67, and silicon nitride for the buffer layers 68, 69 and 70, can also be used in this engineered structure. Rare earth oxides, which also contain luminescent centers, can also be used in the active layers 65, 66 and 67.

The density of the nano-particles in any layer can be changed by varying the excess silicon content in said layer during deposition and by varying the annealing conditions (annealing temperature and time, for example). The nano-particle density, within the nano-particle layers 65, 66 and 67, is preferably as high as possible to increase the intensity of emitted light, while still remaining below the density that would result in interactions between nanocrystals, or agglomeration of nano-particles.

The total number of repeated layers 65 to 70 in the active layer structure 22''' is determined by the voltage that will be applied to the entire film and by the electric field required for efficient and reliable operation. In a simple approximation, very little voltage is dropped across the nano-particle layers 65, 66 and 67, so that the number of layers required will be equal to the applied voltage divided by the electric field and divided by the thickness of the buffer layers 68, 69 and 70. For example, if the applied voltage is 110 V, the desired electric field within one dielectric layer 69 is 5 MV/cm (i.e. 0.5 V/nm), and the desired excitation energy is 2.3 eV, whereby the nano-particle layer 66 is 2.1 nm thick and the buffer layer is 4.6 nm thick, then the total number of repeated layer pairs 66/69 is:

(110 V)/(0.5 V/nm)/(4.6 nm)=48 layers or pairs.

A single color can be emitted by an engineered film active layer structure 22'' by repeating identical pairs of active and buffer layers. Mixed colors, e.g. white, can be emitted by the engineered active layer structure 22''', since the entire film will comprise several layer pairs for each constituent color. For example, N pairs of active/dielectric layers altogether may comprise k pairs for blue 65/68, m pairs for green 66/69, and n pairs for amber/red/orange 67/70, where k+m+n=N. The number of each of the color pairs, e.g. 65/68, 66/69 and 67/70, can be varied so that any desired color rendering index (CRI) can be achieved. For example, a warm white requires more pairs of red than blue 65/68, while a cool white requires the opposite.

For white or other multi-color light emission, and for a device 20 or 120, in which a back reflector 29 is included in the structure, it is preferable to place the lowest energy (longest wavelength, e.g. red) emission layers nearest to the reflector 29 and the highest energy (shortest wavelength, e.g. blue) layers nearest to the emitting surface. Layers emitting intermediate wavelengths, e.g. green, are placed intermediate the layers emitting the longest and shortest wavelengths.

Figure 22:
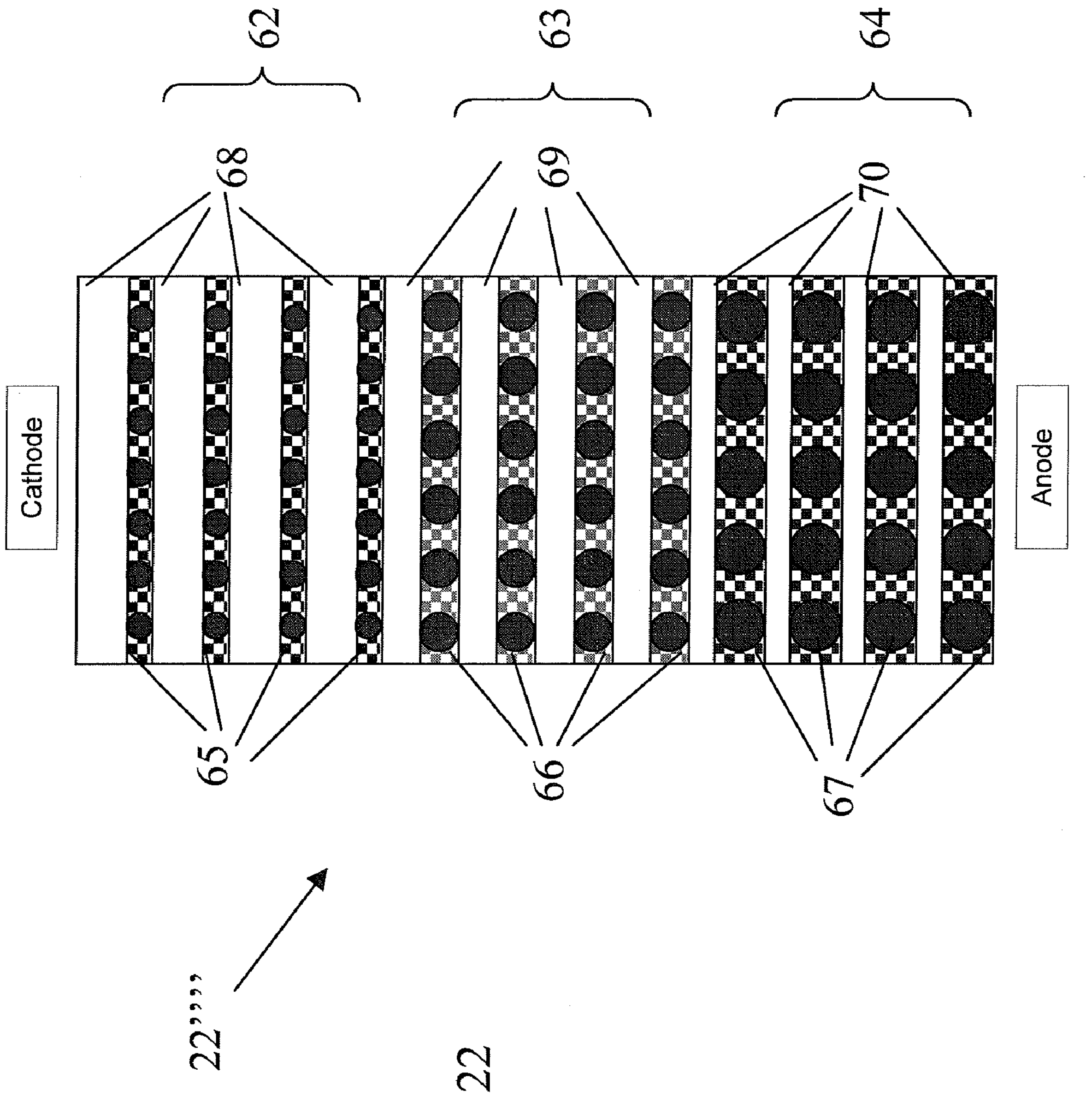
FIG. 22 illustrates an alternative embodiment of an active layer structure of the device of FIG. 5*a* or 5*b*.

FIG. 22 illustrates an engineered film active layer structure 22'''' powered by DC electrical power, i.e. an anode 62 and a cathode 63. The active layers 65, 66 and 67 and most of the buffer layers 68, 69 and 70 are identical to those in the engineered film structure 22'''; however, since the electrons only travel in one direction, the intervening buffer layers between different types of active layers must be the correct thickness to excite the nano-particles in the nano-particle layer closer to the anode. Accordingly, the engineered film structure 22'''' is preferably terminated by a buffer layer 68 at the cathode and by a nano-particle layer 67 at the anode.

We claim:

1. A light emitting device comprising:

a substrate;

an active layer structure supported on the substrate including at least a first active layer with a concentration of luminescent centers for emitting light at a first wavelength;

a set of electrodes for applying an electric field to the active layer structure including an upper transparent electrode and a second base electrode;

a metal electrical contact electrically connected to the transparent electrode for applying the electric field thereto;

a field oxide region below the electrical contact and below a covered section of the active layer structure, which is below the electrical contact, for minimizing current injection into the covered section, thereby maximizing current flow in the active layer structure adjacent to the covered section;

wherein the active layer structure comprises a first buffer layer comprising a wide bandgap semiconductor or dielectric material adjacent to the first active layer; and wherein the first buffer layer has a thickness, whereby electrons gains sufficient energy from the electric field when passing through the first buffer layer to excite the luminescent centers in the first active layer via impact ionization or impact excitation at a sufficient excitation energy to emit light at the first wavelength.

2. The device according to claim 1, wherein the field oxide region has a sloped edge providing a gradual reduction in vertical electric field between the upper transparent electrode and the substrate.

3. The device according to claim 1, wherein the field oxide region has a thickness which is two to ten times a thickness of the active layer structure.

4. The device according to claim 1, wherein the field oxide region comprises a grid pattern of parallel and perpendicular field oxide sections;

wherein the active layer structure is disposed over top of the field oxide sections defining light emitting well portions between covered sections.

5. The device according to claim 4, wherein the well portions are 5 microns to 5000 microns wide.

6. The device according to claim 1, further comprising an encapsulant layer, over top of the transparent electrode, having a refractive index closely matched to the refractive index of the active layer structure to reduce total internal reflections therebetween.

7. The device according to claim 6, wherein the encapsulant layer has a curved upper surface providing lensing effects to emitted light to maximize the amount of light extracted.

8. The device according to claim 1, further comprising a reflective layer between the bottom electrode and the active layer structure for reflecting light back through the upper transparent electrode.

9. The device according to claim 1, wherein the active layer structure further comprises a plurality of first active layers interleaved with a plurality of first buffer layers.

10. The device according to claim 9, wherein the active layer structure further comprise:

a plurality of second active layers including a concentration of luminescent centers for emitting light at a second wavelength; and a plurality of second buffer layers comprising wide bandgap semiconductor or dielectric material interleaved with the plurality of second active layers;

wherein the second buffer layers have a thickness, whereby electrons gains sufficient energy from the electric field when passing through the second buffer layers to excite the luminescent centers in the second active layers via impact ionization or impact excitation at a sufficient excitation energy to emit light at the second wavelength.

wherein the first and second wavelengths combine to form a desired color of light.

11. A light emitting device comprising:

a substrate;

an active layer structure supported on the substrate including at least a first active layer with a concentration of luminescent centers for emitting light at a first wavelength;

a set of electrodes for applying an electric field to the active layer structure including an upper transparent electrode and a second base electrode;

a metal electrical contact electrically connected to the transparent electrode for applying the electric field thereto;

a field oxide region below the electrical contact and below a covered section of the active layer structure, which is below the electrical contact, for minimizing current injection into the covered section, thereby maximizing current flow in the active layer structure adjacent to the covered section; and a first transition layer, between the upper transparent electrode and the active layer structure, having a higher conductivity than a top layer of the active layer structure;

whereby high field regions associated with the active layer structure are moved back and away from a first contact region between the active layer structure and the transparent electrode;

thereby reducing the electric field necessary to generate a desired current to flow across the first contact region, and reducing associated deleterious effects of larger electric fields.

12. The device according to claim 11, further comprising a second transition layer, between the substrate and the active layer structure, having a higher conductivity than a bottom layer of the active layer structure;

whereby high field regions associated with the active layer structure are moved back and away from a second contact region between the active layer structure and the substrate;

thereby reducing the electric field necessary to generate the desired current to flow across the second contact region, and reducing associated deleterious effects of larger electric fields.

13. The device according to claim 11, wherein the first transition layer has a thickness, which is 2.5% to 10% of a thickness of the active layer structure, thereby enabling energetic electrons emerging from the active layer structure to sufficiently cool.

14. The device according to claim 13, wherein the first transition layer has a thickness, which is 4% to 6% of a thickness of the active layer structure.

15. The device according to claim 11, wherein the active layer structure comprises a first buffer layer comprising a wide bandgap semiconductor or dielectric material adjacent to the first active layer; wherein the first buffer layer has a thickness, whereby electrons gains sufficient energy from the electric field when passing through the first buffer layer to excite the luminescent centers in the first active layer via impact ionization or impact excitation at a sufficient excitation energy to emit light at the first wavelength.

16. The device according to claim 15, wherein the active layer structure further comprises a plurality of first active layers interleaved with a plurality of first buffer layers.

17. The device according to claim 16, wherein the active layer structure further comprise:

a plurality of second active layers including a concentration of luminescent centers for emitting light at a second wavelength; and a plurality of second buffer layers comprising wide bandgap semiconductor or dielectric material interleaved with the plurality of second active layers;

wherein the second buffer layers have a thickness, whereby electrons gains sufficient energy from the electric field when passing through the second buffer layers to excite the luminescent centers in the second active layers via impact ionization or impact excitation at a sufficient excitation energy to emit light at the second wavelength.

wherein the first and second wavelengths combine to form a desired color of light.

18. The device according to claim 17, wherein the set of electrodes are powered by an alternating current power source; and wherein one of the first dielectric layers is disposed at one end of the active layer structure, and one of the second dielectric layers is disposed at another end of the active layer structure to ensure that the luminescent centers in all of the first and second active layers are excited when the electric field changes direction.

19. The device according to claim 15, wherein the first active layer comprises a wide bandgap semiconductor or dielectric material with semiconductor nano-particles embedded therein.

20. The device according to claim 19, wherein the transition layer is comprised of a wide bandgap semiconductor or dielectric material with a higher concentration of semiconductor material than the first buffer layer.

* * * * *